(12) United States Patent
Choi et al.

(10) Patent No.: US 10,228,591 B2
(45) Date of Patent: Mar. 12, 2019

(54) LIQUID CRYSTAL POLYMER COMPOSITION, LIQUID CRYSTAL DISPLAY AND METHOD FOR MANUFACTURING THE SAME

(71) Applicant: LG DISPLAY CO., LTD., Seoul (KR)

(72) Inventors: Wonjin Choi, Seoul (KR); Geesung Chae, Incheon (KR); Dongcheon Shin, Goyang-si (KR); Jinki Kim, Gwangju (KG); Hyesun Son, Goyang-si (KR); Sejin Jang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/277,364

(22) Filed: Sep. 27, 2016

(65) Prior Publication Data

US 2017/0023819 A1    Jan. 26, 2017

Related U.S. Application Data

(62) Division of application No. 14/317,964, filed on Jun. 27, 2014, now Pat. No. 9,507,215.

(30) Foreign Application Priority Data

Jun. 28, 2013  (KR) .................. 10-2013-0076050
Jul. 19, 2013  (KR) .................. 10-2013-0085260

(51) Int. Cl.
| | | |
|---|---|---|
| C09K 19/54 | (2006.01) | |
| G02F 1/1339 | (2006.01) | |
| G03F 7/20 | (2006.01) | |
| G02F 1/1333 | (2006.01) | |
| G02F 1/1335 | (2006.01) | |
| G02F 1/1368 | (2006.01) | |
| H01L 29/66 | (2006.01) | |
| G02F 1/1343 | (2006.01) | |
| G02F 1/1362 | (2006.01) | |
| C08F 220/18 | (2006.01) | |
| C08F 220/28 | (2006.01) | |

(52) U.S. Cl.
CPC ........ *G02F 1/13394* (2013.01); *C08F 220/18* (2013.01); *C08F 220/28* (2013.01); *C09K 19/54* (2013.01); *C09K 19/542* (2013.01); *G02F 1/1368* (2013.01); *G02F 1/133345* (2013.01); *G02F 1/133365* (2013.01); *G02F 1/133512* (2013.01); *G02F 1/133514* (2013.01); *G02F 1/134363* (2013.01); *G02F 1/136227* (2013.01); *G03F 7/203* (2013.01); *G03F 7/2022* (2013.01); *H01L 29/66742* (2013.01); *C08F 2220/1841* (2013.01); *C08F 2220/1875* (2013.01); *C08F 2220/281* (2013.01); *C09K 2019/546* (2013.01); *G02F 2001/13398* (2013.01); *G02F 2001/133519* (2013.01); *G02F 2201/121* (2013.01); *G02F 2201/123* (2013.01)

(58) Field of Classification Search
CPC .................. C08F 220/18; C08F 220/28; C08F 2220/1841; C08F 2220/1875; C08F 2220/281; C09K 19/542; C09K 19/54; C09K 2019/546; G03F 7/028; G03F 7/031
USPC ........................................ 430/20, 281.1, 321
See application file for complete search history.

(56) References Cited

U.S. PATENT DOCUMENTS 5,906,770 A * 5/1999 Amundson .......... C09K 19/544
                                                                  252/299.01

FOREIGN PATENT DOCUMENTS

| CN | 1974616 A | 6/2007 |
|---|---|---|
| CN | 102863908 A | 1/2013 |
| EP | 0590984 A1 | 4/1994 |
| EP | 0634685 A2 | 1/1995 |
| EP | 0791641 A1 | 8/1997 |
| EP | 0634685 B1 | 5/2004 |
| JP | H0784244 A | 3/1995 |
| JP | H07120730 A | 5/1995 |
| JP | H10007617 A | 1/1998 |
| JP | H11181010 A | 7/1999 |
| JP | 2005309365 A | 11/2005 |
| JP | 2010191450 A | 9/2010 |
| JP | 2011105902 A | 6/2011 |
| KR | 20090058284 | 6/2009 |

OTHER PUBLICATIONS

Extended European Search Report issued in corresponding European Patent Application No. 14172512.7, dated Oct. 29, 2014, 7 pages.

Office Action from corresponding Japanese Application No. 2014-129078, dated May 19, 2015, 5 pages.

Office Action from corresponding Chinese Patent Application No. 201410290257.5, dated Jul. 5, 2016, 13 pages.

* cited by examiner

*Primary Examiner* — John A McPherson

(74) *Attorney, Agent, or Firm* — Seed IP Law Group LLP

(57) ABSTRACT

A liquid crystal polymer composition comprising a liquid crystal, acrylic monomers including an acrylic monomer group (A) including a cyclic ring and an acrylic monomer group (B) including a chain structure or a cyclohexanol, and a photo initiator.

12 Claims, 43 Drawing Sheets

| A : C | LC : M | PI | 10% | 20% | 30% |
|---|---|---|---|---|---|
| 6 : 4 | 9 : 1 | Dar-1173 | | | |
| | | Irg-2959 | | | |
| | | Irg-651 | | | |
| | 8 : 2 | Dar-1173 | | | |
| | | Irg-2959 | | | |
| | | Irg-651 | | | |

FIG. 8A

| B:C | LC:M | PI | 10% | 20% | 30% |
|---|---|---|---|---|---|
| 9:1 | 9:1 | Dar-1173 | | | |
| | | Irg-2959 | | | |
| | | Irg-651 | | | |
| | 8:2 | Dar-1173 | | | |
| | | Irg-2959 | | | |
| | | Irg-651 | | | |

FIG. 8B

| B:C | LC:M | PI | 10% | 20% | 30% |
|---|---|---|---|---|---|
| 8:2 | 9:1 | Dar-1173 | | | |
| | | Irg-2959 | | | |
| | | Irg-651 | | | |
| | 8:2 | Dar-1173 | | | |
| | | Irg-2959 | | | |
| | | Irg-651 | | | |

FIG. 8D

| B:C | LC:M | PI | 10% | 20% | 30% |
|---|---|---|---|---|---|
| 6:4 | 9:1 | Dar-1173 | | | |
| | | Irg-2959 | | | |
| | | Irg-651 | | | |
| | 8:2 | Dar-1173 | | | |
| | | Irg-2959 | | | |
| | | Irg-651 | | | |

FIG. 9B

| D:C | LC:M | PI | 10% | 20% | 30% |
|---|---|---|---|---|---|
| 8:2 | 9:1 | Dar-1173 | | | |
| | | Irg-2959 | | | |
| | | Irg-651 | | | |
| | 8:2 | Dar-1173 | | | |
| | | Irg-2959 | | | |
| | | Irg-651 | | | |

FIG. 10B

| E:C | LC:M | PI | 10% | 20% | 30% |
|---|---|---|---|---|---|
| 8:2 | 9:1 | Dar-1173 | | | |
| | | Irg-2959 | | | |
| | | Irg-651 | | | |
| | 8:2 | Dar-1173 | | | |
| | | Irg-2959 | | | |
| | | Irg-651 | | | |

FIG. 10D

| E:C | LC:M | PI | 10% | 20% | 30% |
|---|---|---|---|---|---|
| 6:4 | 9:1 | Dar-1173 | | | |
| | | Irg-2959 | | | |
| | | Irg-651 | | | |
| | 8:2 | Dar-1173 | | | |
| | | Irg-2959 | | | |
| | | Irg-651 | | | |

FIG. 11A

| F:C | LC:M | PI | 10% | 20% | 30% |
|---|---|---|---|---|---|
| 9:1 | 9:1 | Dar-1173 | | | |
| | | Irg-2959 | | | |
| | | Irg-651 | | | |
| | 8:2 | Dar-1173 | | | |
| | | Irg-2959 | | | |
| | | Irg-651 | | | |

FIG. 11B

| F:C | LC:M | PI | 10% | 20% | 30% |
|---|---|---|---|---|---|
| 8:2 | 9:1 | Dar-1173 | | | |
| | | Irg-2959 | | | |
| | | Irg-651 | | | |
| | 8:2 | Dar-1173 | | | |
| | | Irg-2959 | | | |
| | | Irg-651 | | | |

| UV curing time | 10 min. | | | 20 min. | | | 30 min. | | | 60 min. | | | 120 min. | | |
|---|---|---|---|---|---|---|---|---|---|---|---|---|---|---|---|
| intensity of illumination | 10 mw | 17.6 mw | 20 mw | 10 mw | 17.6 mw | 20 mw | 10 mw | 17.6 mw | 20 mw | 10 mw | 17.6 mw | 20 mw | 10 mw | 17.6 mw | 20 mw |
| content of acrylic monomer (%) A (note1) | 0.65 | 0.64 | 0.84 | 0.42 | 0.34 | 0.93 | 0.37 | 0.56 | 0.65 | 0.17 | 0.03 | 0.46 | 0.10 | 0.27 | 0.32 |
| content of acrylic monomer (%) B (note2) | 1.70 | 2.12 | 2.15 | 0.57 | 1.47 | 2.00 | 0.58 | 1.29 | 1.26 | 0.31 | 0.52 | 0.76 | 0.27 | 0.38 | 0.39 |
| content of acrylic monomer (%) A+B | 2.35 | 2.76 | 2.99 | 0.99 | 1.81 | 2.93 | 0.95 | 1.85 | 1.88 | 0.48 | 0.55 | 1.22 | 0.37 | 0.65 | 0.71 | note1) A:Methylheptyl acrylate
note2) B:iso-Bornyl methacrylate

| Hotplate temperature | | 35°C | | 45°C | | 55°C | | 65°C | | 80°C | |
|---|---|---|---|---|---|---|---|---|---|---|---|
| UV curing time | | #1 | #2 | #1 | #2 | #1 | #2 | #1 | #2 | #1 | #2 |
| content of acrylic monomer (%) | A | 0.37 | 0.10 | 0.38 | 0.09 | 0.42 | 0.09 | 0.46 | 0.11 | 0.17 | 0.08 |
| | B | 1.20 | 0.42 | 1.23 | 0.42 | 1.20 | 0.41 | 1.24 | 0.45 | 1.11 | 0.42 |
| | A+B | 1.57 | 0.52 | 1.61 | 0.51 | 1.62 | 0.50 | 1.70 | 0.56 | 1.28 | 0.50 |
| reduction rate(%) | | 67 | | 68 | | 69 | | 67 | | 61 | |

LIQUID CRYSTAL POLYMER COMPOSITION, LIQUID CRYSTAL DISPLAY AND METHOD FOR MANUFACTURING THE SAME

The present patent document is a divisional of U.S. patent application Ser. No. 14/317,964, filed on Jun. 27, 2014, which claims the priority benefit to Korean Patent Application No. 10-2013-0076050 filed on Jun. 28, 2013, and Korean Patent Application No. 10-2013-0085260 filed on Jul. 19, 2013, which is incorporated herein by reference for all purposes as if fully set forth herein.

BACKGROUND

Field of the Disclosure

Embodiments of the disclosure relate to a liquid crystal display (LCD), and more particularly, to a liquid crystal polymer composition capable of preventing a defect due to a change in a liquid crystal cell gap and improving reliability by enhancing adhesive strength of a barrier rib, a liquid crystal display (LCD) device including the same, and a method for manufacturing the same.

Discussion of the Related Art

The advancement of the information-oriented society has increased demand for display devices in various forms. Recently, various flat display devices such as a liquid crystal display (LCD), a plasma display panel (PDP), an organic light emitting display (OLED), and the like, have been researched and some of these have already been utilized as display devices in various equipment.

Among them, LCDs, advantageously having excellent image quality, being lighter and thinner, and consuming a small amount of power, have been commonly used and variously developed as monitors of televisions and computers that receive and display broadcast signals, as well as for a portability purpose such as monitors of notebook computers.

A general LCD device includes a thin film transistor (TFT) array substrate in which TFTs and electrodes are formed, a color filter substrate in which R, G, and B color filters are formed, and a liquid crystal layer injected therebetween. In the LCD, liquid crystal of the liquid crystal layer is aligned by an electric field between the electrodes, and an image may be displayed by adjusting an amount of light that transmits through the liquid crystal layer according to a degree of alignment of the liquid crystal. A barrier rib is formed to maintain a predetermined interval in which the liquid crystal layer is formed between the TFT array substrate and the color filter array substrate of the LCD device. The barrier rib is fixedly formed to have a columnar shape with a predetermined height during a TFT array substrate manufacturing process.

Recently, materials of substrates have been changed from glass to plastic. However, in case of a plastic substrate, a cell gap of liquid crystal is not maintained and seal bursts as liquid crystal concentrates on one side, or the like. Unlike glass, the plastic substrate has low rigidity, requiring a wall maintaining upper and lower plates and preventing concentration of liquid crystal, but current structures lack ability to solve the problem.

SUMMARY

Embodiments of the invention provide a liquid crystal polymer composition capable of maintaining a liquid crystal cell gap and solving a problem such as seal burst, and the like, a liquid crystal display (LCD) device including the same, and a method for manufacturing the same.

In one aspect, there is a liquid crystal polymer composition comprising a liquid crystal, acrylic monomers including an acrylic monomer group (A) including a cyclic ring and an acrylic monomer group (B) including a chain structure or a cyclohexanol, and a photo initiator.

In another aspect, there is a liquid crystal display device including a liquid crystal layer interposed between a thin film transistor (TFT) array substrate and a color filter array substrate, the liquid crystal display device comprising barrier ribs positioned within the liquid crystal layer and supporting the TFT array substrate and the color filter array substrate, wherein the barrier ribs are formed by curing acrylic monomers of the liquid crystal polymer composition.

In other aspect, there is a method for manufacturing a liquid crystal display device, the method comprising forming a cell by attaching a thin film transistor (TFT) array substrate and a color filter array substrate, injecting a liquid crystal polymer composition including a liquid crystal, acrylic monomers including an acrylic monomer group (A) including a cyclic ring and an acrylic monomer group (B) including a chain structure or a cyclohexanol, and a photo initiator into the cell, and irradiating UV light to the cell to cure the acrylic monomers to form barrier ribs.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

Figure 7C:
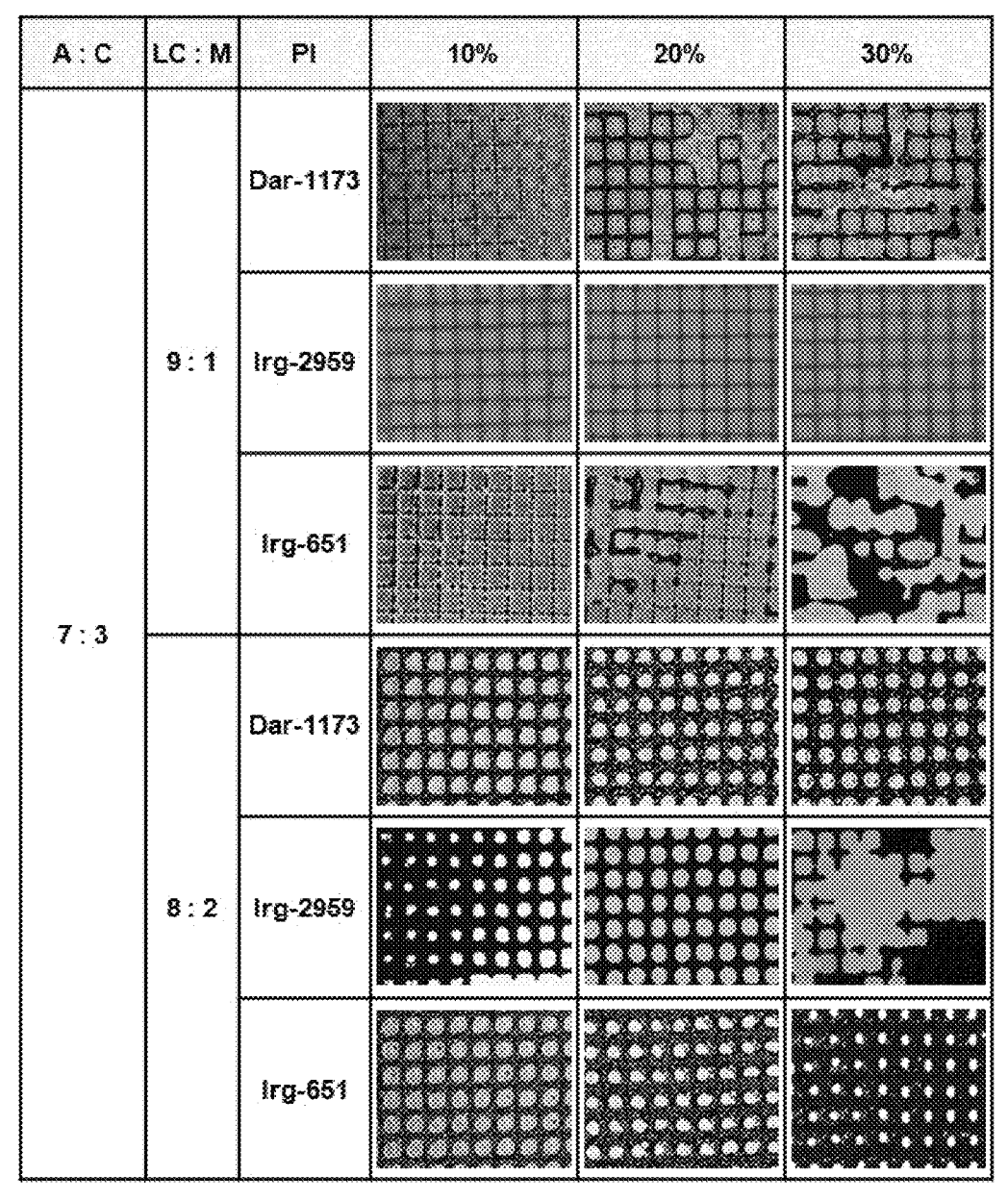

FIGS. 7A to 7D are images of barrier ribs formed by using isodecylacrylate and isobornyl acrylate according to Embodiment 1 of the present invention.

FIGS. 8A to 8D are images of barrier ribs formed by using 3,3,5 trimethylcyclohexanol acrylate and isobornyl acrylate according to Embodiment 1 of the present invention.

FIGS. 9A to 9D are images of barrier ribs formed by using octyldecyl acrylate and isobornyl acrylate according to Embodiment 1 of the present invention.

FIGS. 10A to 10D are images of barrier ribs formed by using tridecylacrylate and isobornyl acrylate according to Embodiment 1 of the present invention.

FIGS. 11A to 11D are images of barrier ribs formed by using 2-ethylhexylacrylate and isobornyl acrylate according to Embodiment 1 of the present invention.

DETAILED DESCRIPTION OF THE EXEMPLARY EMBODIMENTS

Figure 1:
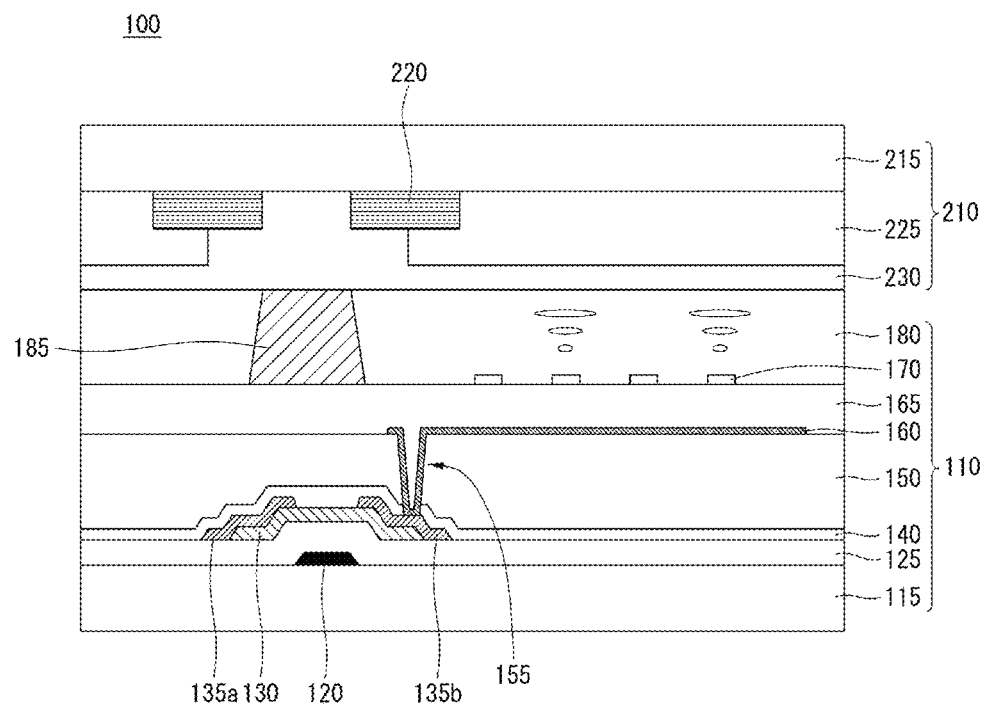
FIGS. 1 to 5 are views illustrating a liquid crystal display (LCD) device having various structures according to an embodiment of the present invention.

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

A liquid crystal polymer composition according to the embodiment of the present invention includes a liquid crystal, acrylic monomers including an acrylic monomer group A including a cyclic ring and an acrylic monomer group B including a chain structure or cyclohexanol, and a photo initiator.

A nematic, smetic, or cholesteric liquid crystal may be used as the liquid crystal used in the liquid crystal polymer composition according to the embodiment of the present invention, and types of liquid crystal are not particularly limited.

The acrylic monomers according to the embodiments include an acrylic monomer group A including a cyclic ring and an acrylic monomer group B including a chain structure or cyclohexanol. Here, the acrylic monomer group A including a cyclic ring includes isobornyl acrylate, or isobornyl methacrylate. The acrylic monomer group A including a cyclic ring is cured later to provide rigidity of a barrier rib.

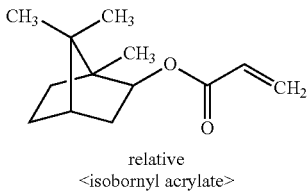

relative
<isobornyl acrylate>

-continued

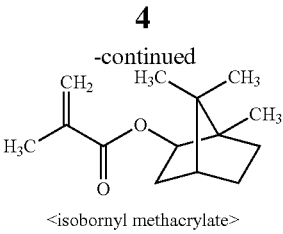

<isobornyl methacrylate>

Also, the acrylic monomer group B including a chain structure or cyclohexanol includes one or more selected from the group consisting of 2-methylheptyl acrylate, isodecyl acrylate, octyldecyl acrylate, tridecyl acrylate, 2-2-ethylhexyl acrylate, and lauryl acrylate. The acrylic monomer group B including a chain structure or cyclohexanol serves to provide patternability (or pattern characteristics) to the barrier rib.

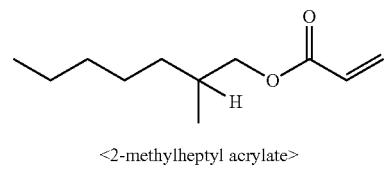

<2-methylheptyl acrylate>

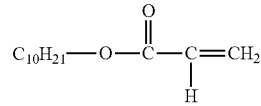

<isodecyl acrylate>

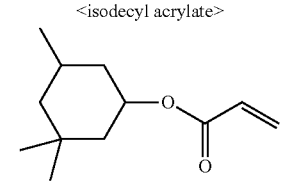

<3,3,5 trimethyl cyclohexanol acrylate>

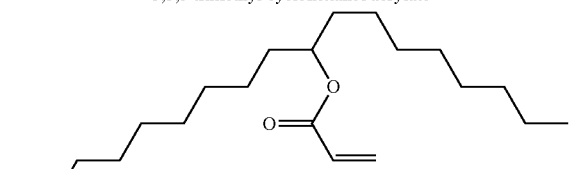

<octyldecyl Acrylate>

<tridecyl acrylate>

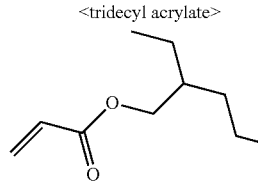

<2-ethylhexyl acrylate>

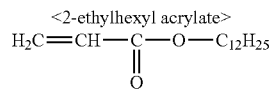

<lauryl Acrylate>

When UV light is irradiated, the liquid crystal and the acrylic monomers of the acrylic polymer are separated in phase and the acrylic monomers are cured to form a bonding layer. Also, since only a small amount of acrylic polymers is contained in the liquid crystal polymer composition, a small amount of uncured monomers remain, obtaining excellent reliability.

The liquid crystal polymer composition according to the embodiment of the present invention includes a photo initiator. As the photo initiator, all the photo initiators such as a free radical photo initiator, a cation photo initiator, and the like, may be used. Specifically, for example, the photo initiator may be one or more selected from the group consisting of 2-benzyl-2-dimethylamino-1-(4-morpholinophenyl)-butanone-1), phenylbis(2,4,6-trimethylbenzoyl)-phosphine oxide, bis(.eta.5-2,4-cylcopentadien-1-yl)-bis(2,6-difluoro-3-(1H-pyrrol-1-yl)-phenyl) titanium, bis(2,4,6-trimethylbenzoyl)-phenylphosphineoxide, 2-dimethylamino-2-(4-methyl-benzyl)-1-(4-morpholin-4-yl-phenyl)-butan-1-one, 2-hydroxy-1-[4-(2-hydroxyethoxy)phenyl]-2-methyl-1-propanone, 1-[9-ethyl-6-(2-methylbenzoyl)-9Hcarbazol-3-yl]-1, 1-(O-acetyloxime), 1-hydroxy-cyclohexyl-phenyl-ketone, oxy-phenyl-acetic acid 2-[2 oxo-2 phenyl-acetoxy-ethoxy]-ethyl ester, 2-methyl-1-[4-(methylthio)phenyl]-2-(4-morpholinyl)-1-propanone), 2,4,6-trimethylbenzoyldiphenylphosphine oxide, 2-hydroxy-2-methyl-1-phenyl-propan-1-one), and 2,2-Dimethoxy-1,2-diphenylethan-1-one.

In the liquid crystal polymer composition according to the embodiment of the present invention, the liquid crystal, the acrylic monomers, and the photo initiator are contained in predetermined content ratios. A content ratio between the liquid crystal and the acrylic monomers may be 8:2 to 9:1. Here, in the case in which the content ratio between the liquid crystal and the acrylic monomers is 8:2, when the content of the acrylic monomers is 2 or less, a degradation of reliability of liquid crystal driving due to residual uncured monomers in a liquid crystal layer may be prevented, and in the case in which the content ratio between the liquid crystal and the acrylic monomer is 9:1, if the content of the acrylic monomers is 1 or more, reliability of barrier ribs formed of the acrylic monomers may be enhanced.

Also, in the acrylic monomers, a content ratio between the acrylic monomer group A including a cyclic ring and the acrylic monomer group B including a chain structure or cyclohexanol may be 8:2 to 9:1. Here, the acrylic monomer group A including a cyclic ring provides rigidity of a barrier rib, and the acrylic monomer group B including a chain structure or cyclohexanol provides pattern characteristics to a barrier rib, and in this case, the content ratio therebetween needs to be appropriately adjusted.

Also, a content ratio between the acrylic monomers and the photo initiator may be 7:3 to 9:1. If the content of the photo initiator is small, monomers may not be reacted to remain, and if the content of the photo initiator is large, the photo initiator may not be reacted to remain. Thus, the content ratio between the acrylic monomers and the photo initiator needs to be appropriately adjusted within a range in which the acrylic monomers and the photo initiator do not remain.

The foregoing liquid crystal polymer composition according to the embodiment of the present invention is injected into a liquid crystal display (LCD) device to form a liquid crystal and a barrier rib. Hereinafter, an LCD device formed of the liquid crystal polymer composition and a method for manufacturing the same will be described.

FIGS. 1 to 5 are views illustrating a liquid crystal display (LCD) device having various structures according to an embodiment of the present invention. Hereinafter, basic components of the LCD will be described with reference to FIG. 1, and only components different from those of FIG. 1 will be described with reference to FIGS. 2 and 5.

Referring to FIG. 1, in the LCD device 100, a gate line 120 is positioned on the lower substrate 115. The gate line 120 acts as a gate electrode by itself. A gate insulating layer 125 is positioned on the gate line 120, and a semiconductor layer 130 is positioned in a region corresponding to the gate line 120. A source electrode 135a and a drain electrode 135b are connected to both sides of the semiconductor layer 130, and a protective layer 140 is positioned to cover them.

An organic insulating layer 150 including a contact hole 155 exposing the drain electrode 135b is positioned on the lower substrate including the protective layer 140, and a pixel electrode 160 is positioned on the organic insulating layer 150. The pixel electrode 160 is connected to the drain electrode 135b through the contact hole 155. A passivation layer 165 is positioned on the lower substrate 115 including the pixel electrode 160, and a common electrode 170 corresponding to the pixel electrode 160 is positioned on the passivation layer 165. A TFT array substrate 110 including a structure from the lower substrate 115 to the common electrode 170 is formed.

Meanwhile, an upper substrate 215 is positioned on the TFT array substrate 110. Black matrices 220 are positioned on the upper substrate 215, and R, G, and B color filters 225 are positioned between the black matrices. An overcoat layer 230 is positioned to cover the black matrices 220 and the color filters 225, forming a color filter array substrate 210. A liquid crystal layer 180 is positioned between the TFT array substrate 110 and the color filter array substrate 210, and a barrier rib 184 for maintaining a gap of the liquid crystal layer 180 is positioned to form the LCD device 100 according to the present invention. The liquid crystal layer 180 and the barrier rib 187 of the LCD device 100 as described above are formed of the liquid crystal polymer composition of the present invention as described above. A specific manufacturing process will be described hereinbelow.

Meanwhile, the barrier rib 185 of the present invention is in contact with flat surfaces between the TFT array substrate 110 and the color filter array substrate 210. However, the barrier rib 185 according to the present invention may have any other contact structure.

Figure 2:
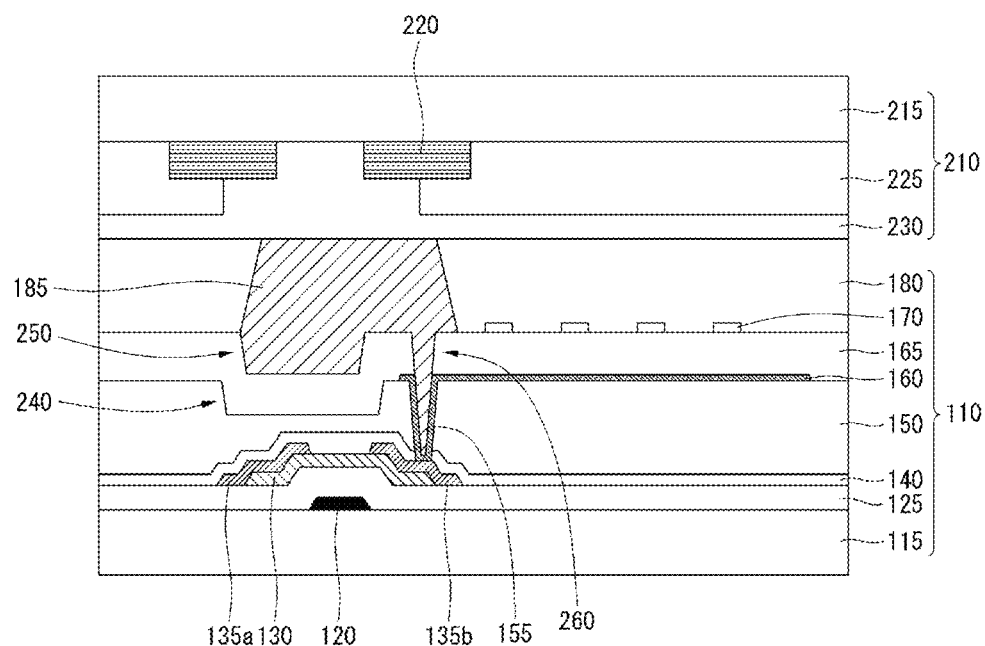

Referring to FIG. 2, the barrier rib 185 is in contact with a third recess 250 and a fourth recess 260 formed in the passivation layer 165. In detail, during a process of forming the contact hole 155 in the organic insulating layer 150 formed on the lower substrate 115, the first recess 240 is formed. The first recess 240 is formed to correspond to the gate line 120. When a silicon nitride (SiNx) is deposited on the organic insulating layer 150 through chemical vapor deposition (CVD) to form the passivation layer 165, the third recess 250 and the fourth recess 260 are formed in accordance with the lower step of the passivation layer 165. Thus, when UV light is irradiated to a liquid crystal polymer composition in a follow-up process, the barrier rib 185 is formed to be in contact with the third and fourth recesses 250 and 260.

Figure 3:
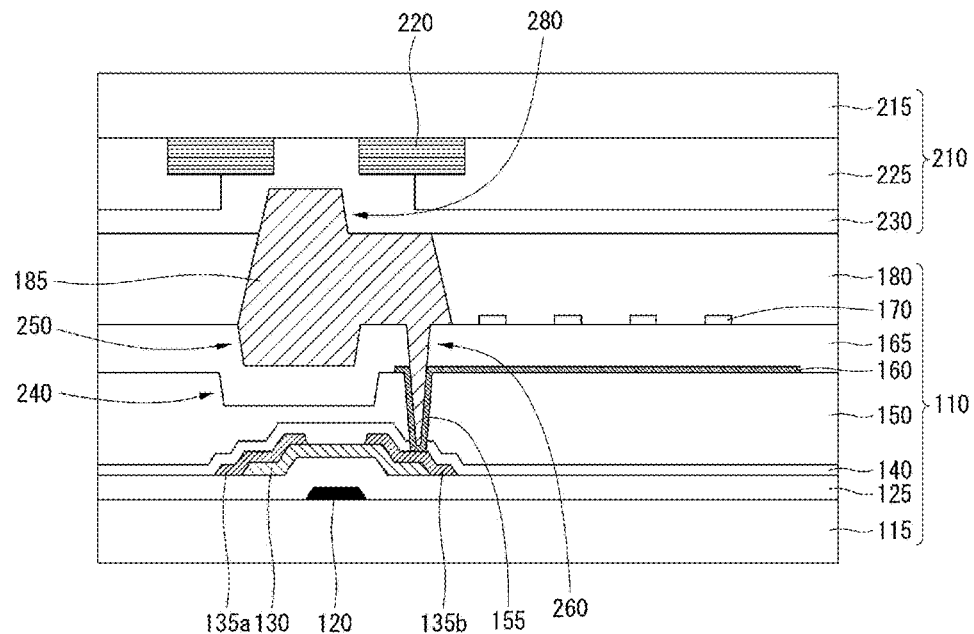

Also, referring to FIG. 3, in addition to the foregoing structure of FIG. 2, the barrier rib 185 is in contact with a fifth recess 280 formed in the overcoat layer 230 of the color filter array substrate 210. The fifth recess 280 is positioned in a region corresponding to the first recess 240. Thus, the barrier rib 185 is formed to be in contact with the fifth recess 280 of the color filter array substrate 210 and the third and fourth recesses 250 and 26 of the TFT array substrate 110.

Figure 4:
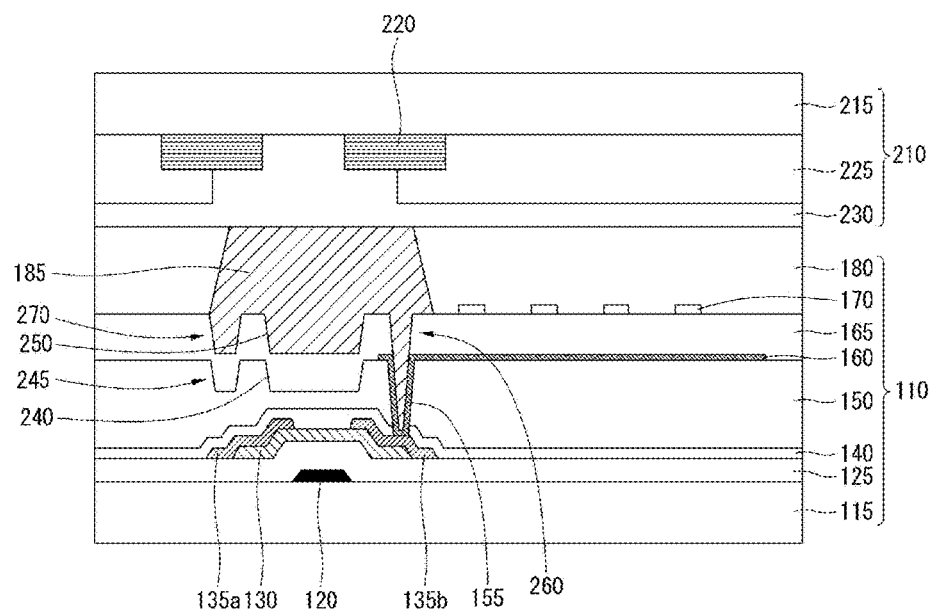

Meanwhile, referring to FIG. 4, the barrier rib 185 is in contact with the third recess 250, the fourth recess 260, and a sixth recess 270 formed in the passivation layer 165. In detail, during a process of forming the contact hole 155 in the organic insulating layer 150 formed on the lower substrate 115, the first recess 240 and the second recess 245 are formed. The first recess 240 is formed to correspond to the gate line 120, and the second recess 245 is formed alongside of the first recess 240. When silicon nitride (SiNx) is deposited on the organic insulating layer 150 through CVD to form the passivation layer 165, the third recess 250, the fourth recess 260, and the sixth recess 270 are formed in accordance with a lower step of the passivation layer 165. Thus, when UV light is irradiated to the liquid crystal polymer composition in a follow-up process, the barrier rib is formed to be in contact with the third recess 250, the fourth recess 260, and the sixth recess 270.

Figure 5:
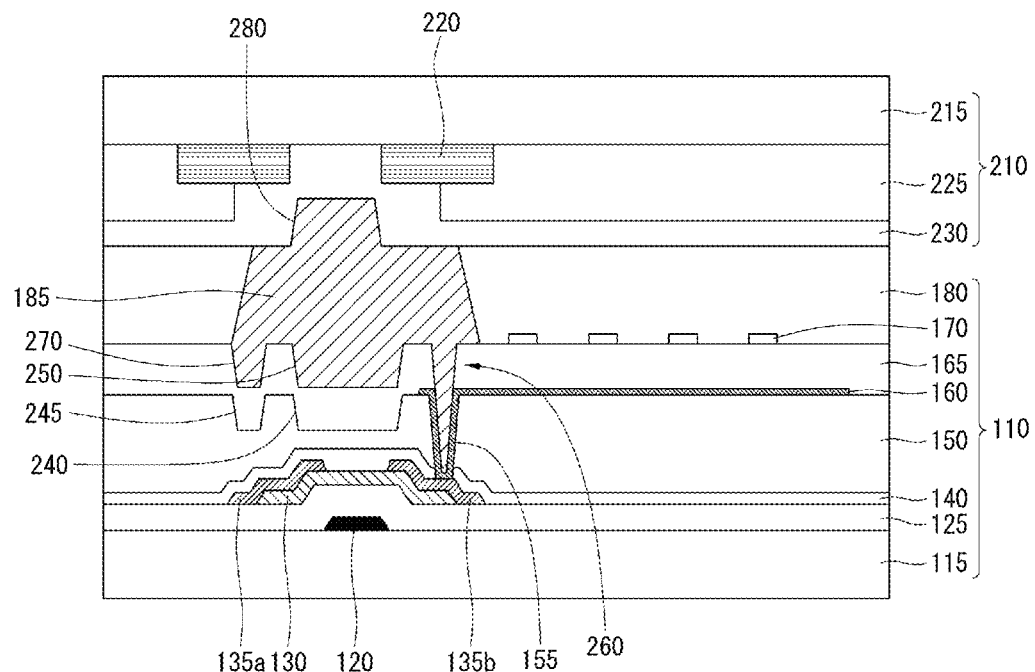

Also, referring to FIG. 5, the barrier rib 185 is further in contact with the fifth recess 280 formed on the overcoat layer 230 of the color filter array substrate 210 in addition to the foregoing structure of FIG. 4. The fifth recess 280 is positioned in a region corresponding to the foregoing first recess 240. Thus, the barrier rib 185 is formed in contact with the fifth recess 280 of the color filter array substrate 310 and the third recess 250, the fourth recess 260, and the sixth recess 270 of the TFT array substrate 110.

As described above, in the LCD device according to the embodiment of the present invention, the barrier rib is formed by irradiating UV light to the liquid crystal polymer composition and a plurality of recesses are formed in the region in which the barrier rib is formed to increase an effective area in which the barrier rib is in contact, thus enhancing adhesive strength of the barrier rib.

A method for manufacturing the LCD device having the foregoing structure will be described with reference to FIGS. 6A to 6F. In the below description, the structure of FIG. 5 including all the processes of the LCD device having the various structures as described above will be taken as an example.

Figure 6A:
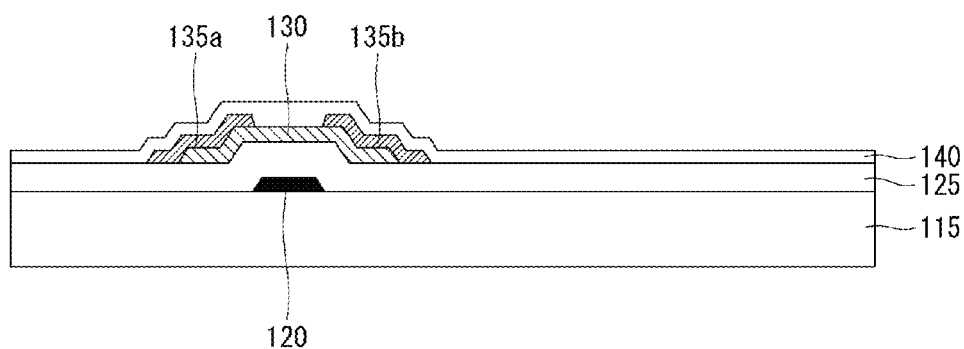
FIGS. 6A to 6F are views illustrating sequential processes of a method for manufacturing a liquid crystal display (LCD) device according

Referring to FIG. 6A, a lower substrate 115 is formed on a first support substrate 50. The first support substrate 50 is a glass substrate, and the lower substrate 115 is formed of polyimide (PI). A gate line 120 is formed on the lower substrate 115. The gate line 120 may be a single layer formed of aluminum (Al), molybdenum (Mo), tungsten (W), titanium (Ti), or an alloy thereof, or may be formed as multiple layers including molybdenum/aluminum/molybdenum (Mo/Al/Mo) or titanium/aluminum/titanium (Ti/Al/Ti). A gate insulating layer 125 is formed on the gate line 120. The gate insulating layer 125 may be formed of a silicon oxide (SiOx), a silicon nitride (SiNx), or a stacked structure of a silicon oxide (SiOx) and a silicon nitride (SiNx).

A semiconductor layer 130 is formed on the gate insulating layer 125. The semiconductor layer 130 may be formed of an amorphous silicon layer, a polycrystalline silicon layer obtained by crystallizing an amorphous silicon layer, or an oxide semiconductor formed of a metal oxide. A source electrode 135a and a drain electrode 135b are formed on both sides of the semiconductor layer 130. The source electrode 135a and the drain electrode 135b may be formed of the same material as that of the foregoing gate line 120. A protective layer 140 is formed on the source electrode 135a and the drain electrode 135b. The protective layer 140 may be formed of a silicon oxide (SiOx), a silicon nitride (SiNx), or a stacked structure of a silicon oxide (SiOx) and a silicon nitride (SiNx).

Figure 6B:
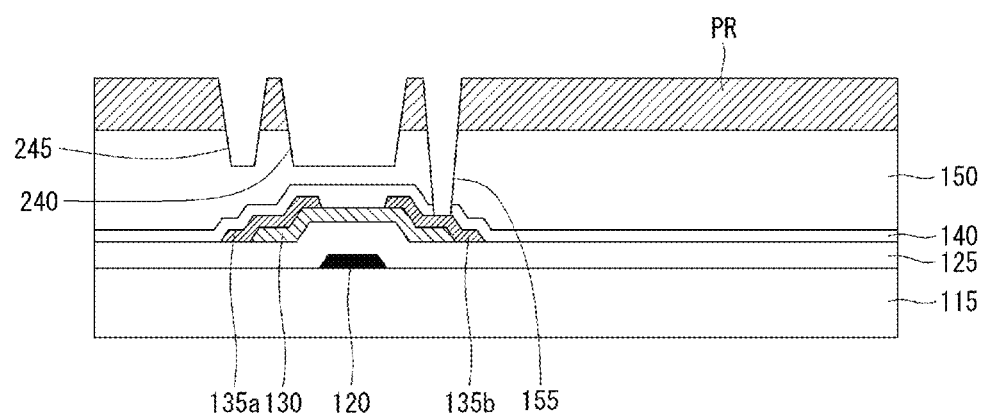

Subsequently, referring to FIG. 6B, an organic insulating layer 150 is formed on the lower substrate 115 with the protective layer 140 formed thereon, and a contact hole 155, a first recess 240 and a second recess 245 are formed on the organic insulating layer 150 through photolithography using photoresist PR. The organic insulating layer 150 is formed of an organic substance such as polyimide, benzocyclobutene series resin, acrylate, or the like. In this case, the contact hole 155 is formed to expose the drain electrode 135b, the first recess 24 is formed in a region corresponding to the gate line 120, and the second recess 245 is formed alongside of the first recess 240.

Figure 6C:
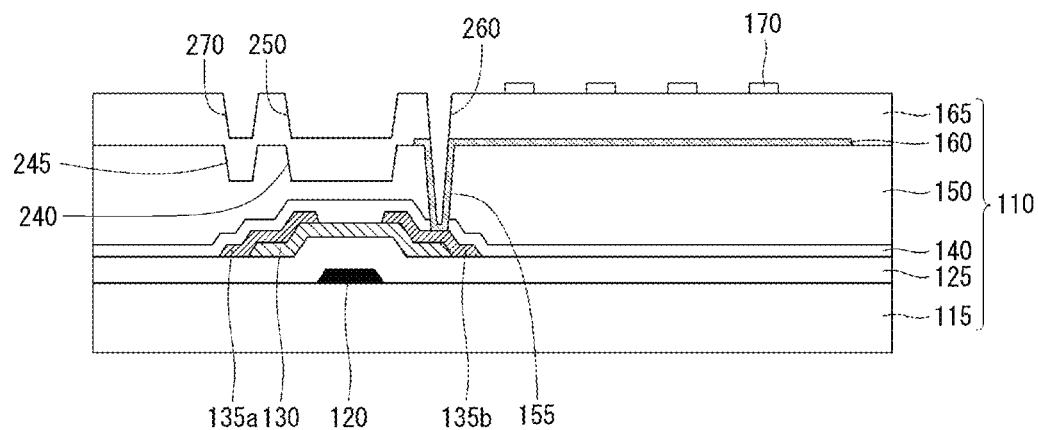

Thereafter, referring to FIG. 6C, a pixel electrode 160 is formed on the organic insulating layer 150 with the first recess 240 and the second recess 245 formed thereon. The pixel electrode 160 may be formed of a transparent conductive layer such as ITO, IZO, or the like. A passivation layer 165 is formed on the lower substrate 115 with the pixel electrode 160 formed thereon. Since a silicon oxide or a silicon nitride is deposited through CVD, the passivation layer 165 is formed in accordance with the lower steps. Thus, the passivation layer 165 has a fourth recess 250 corresponding to the first recess 240 formed in the lower organic insulating layer 150, a sixth recess 270 corresponding to the second recess 245, and a fourth recess 260 corresponding to the contact hole 155. Subsequently, a common electrode 170 corresponding to the pixel electrode 160 is formed on the passivation layer 165 to form a TFT array substrate 110.

Figure 6D:
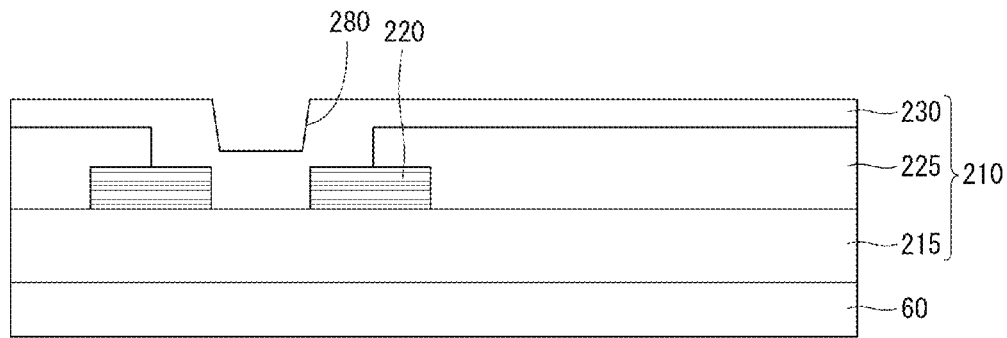

Subsequently, referring to FIG. 6D, an upper substrate 215 is formed on a second support substrate 60, and black matrices 220 are patterned to be formed on the upper substrate 215. R, G, and B color filters 225 are formed in pixel regions demarcated by the black matrices 220, and an overcoat layer 230 is formed thereon. A partial region of the overcoat layer 230, namely, a region corresponding to the gate line is patterned to form a fifth recess 280 to form a color filter array substrate 210.

Figure 6E:
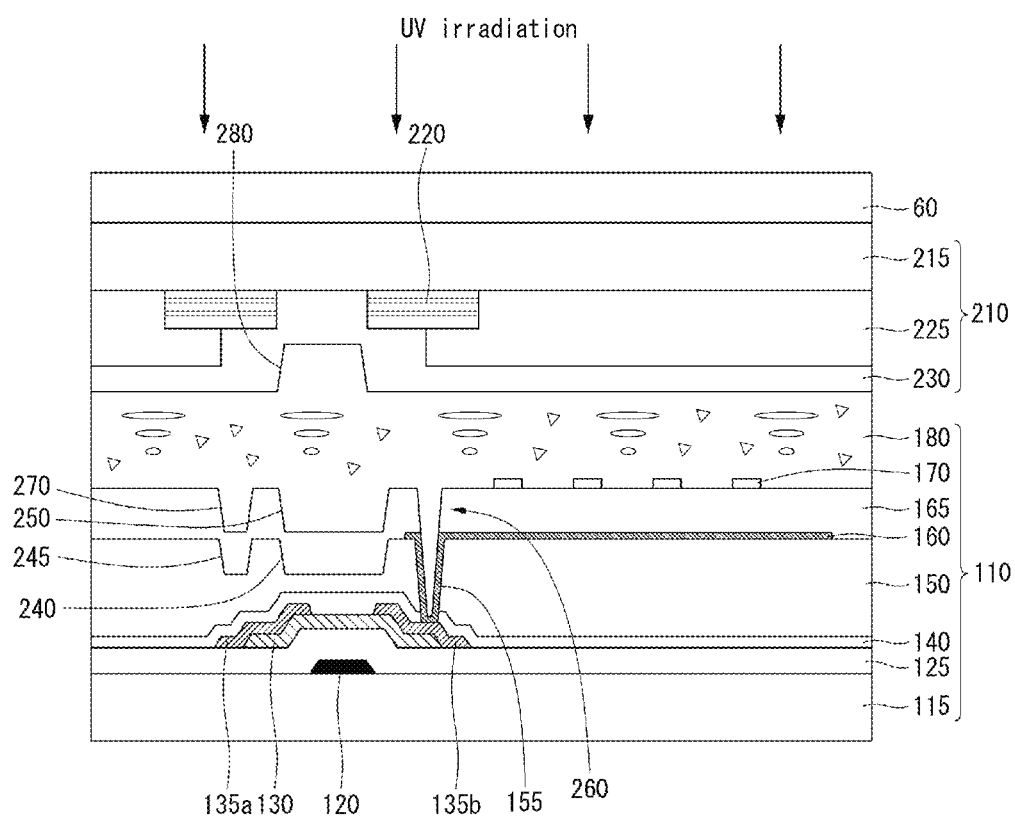

Thereafter, referring to FIG. 6E, the manufactured TFT array substrate 110 and the color filter array substrate 210 are attached, and the liquid crystal polymer composition according to the embodiment of the present invention as described above is injected therebetween to form a liquid crystal layer 180 to form a cell. In this case, the liquid crystal polymer composition includes a liquid crystal, acrylic monomers including an acrylic monomer group A including a cyclic ring and an acrylic monomer group B including a chain structure or cyclohexanol, and a photo initiator.

Figure 6F:
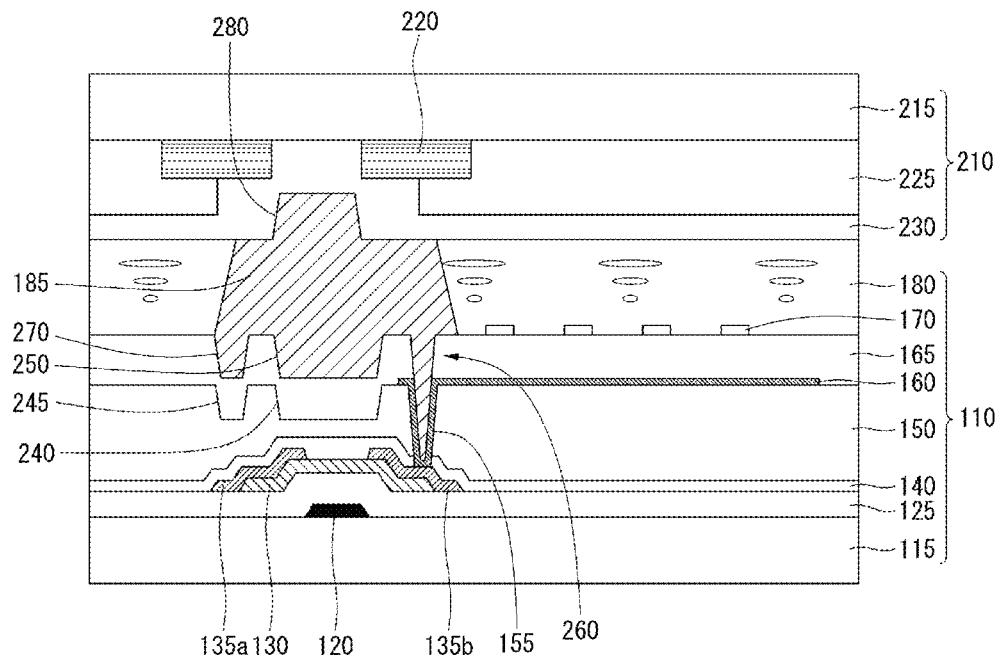
Figure 7A:
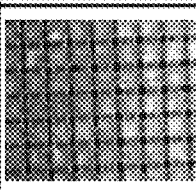
Figure 7B:
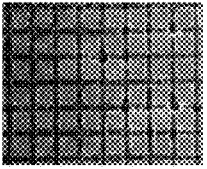
Figure 8C:
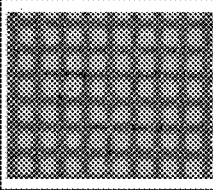
Figure 9A:
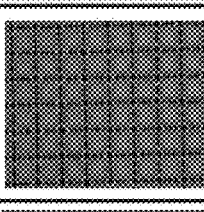
Figure 9C:
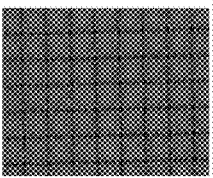
Figure 9D:
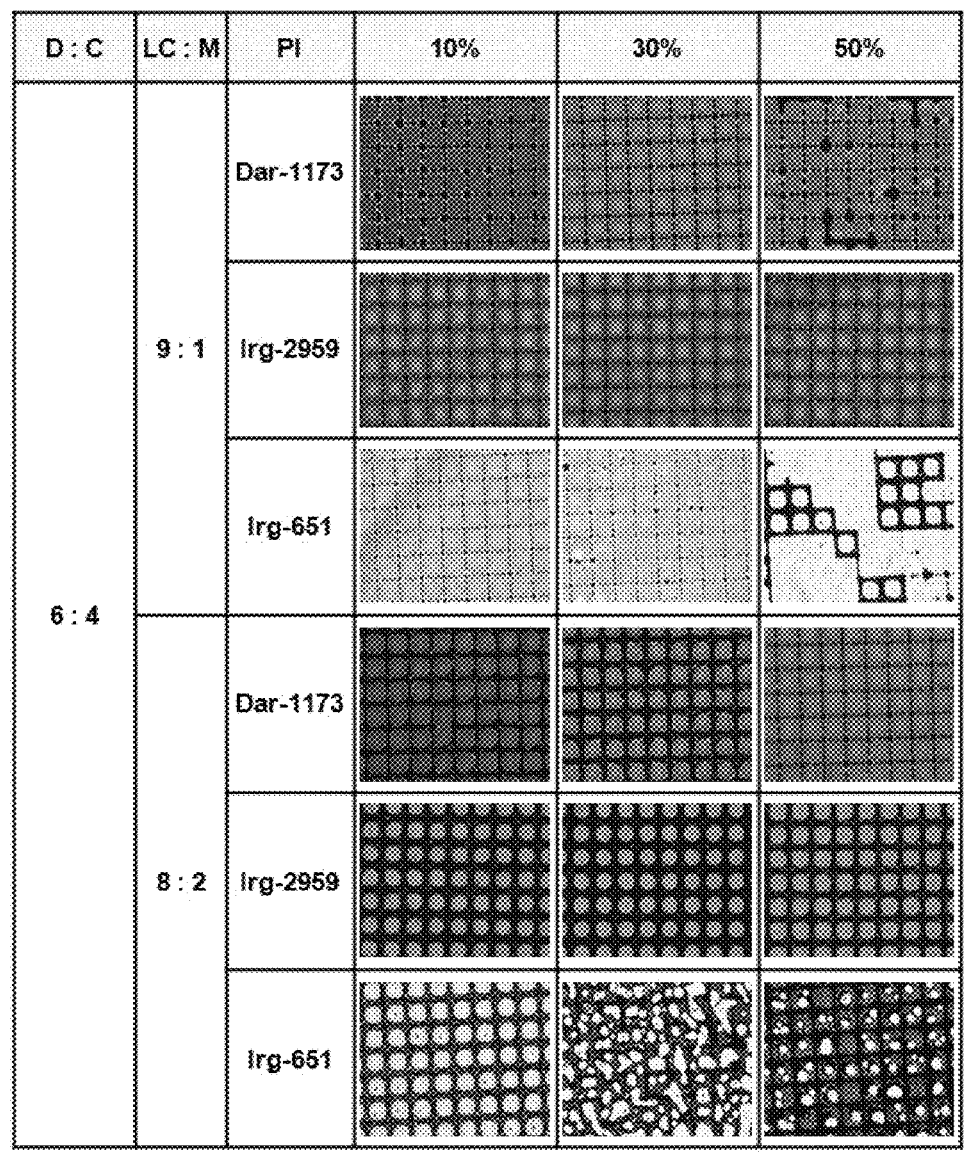
Figure 10A:
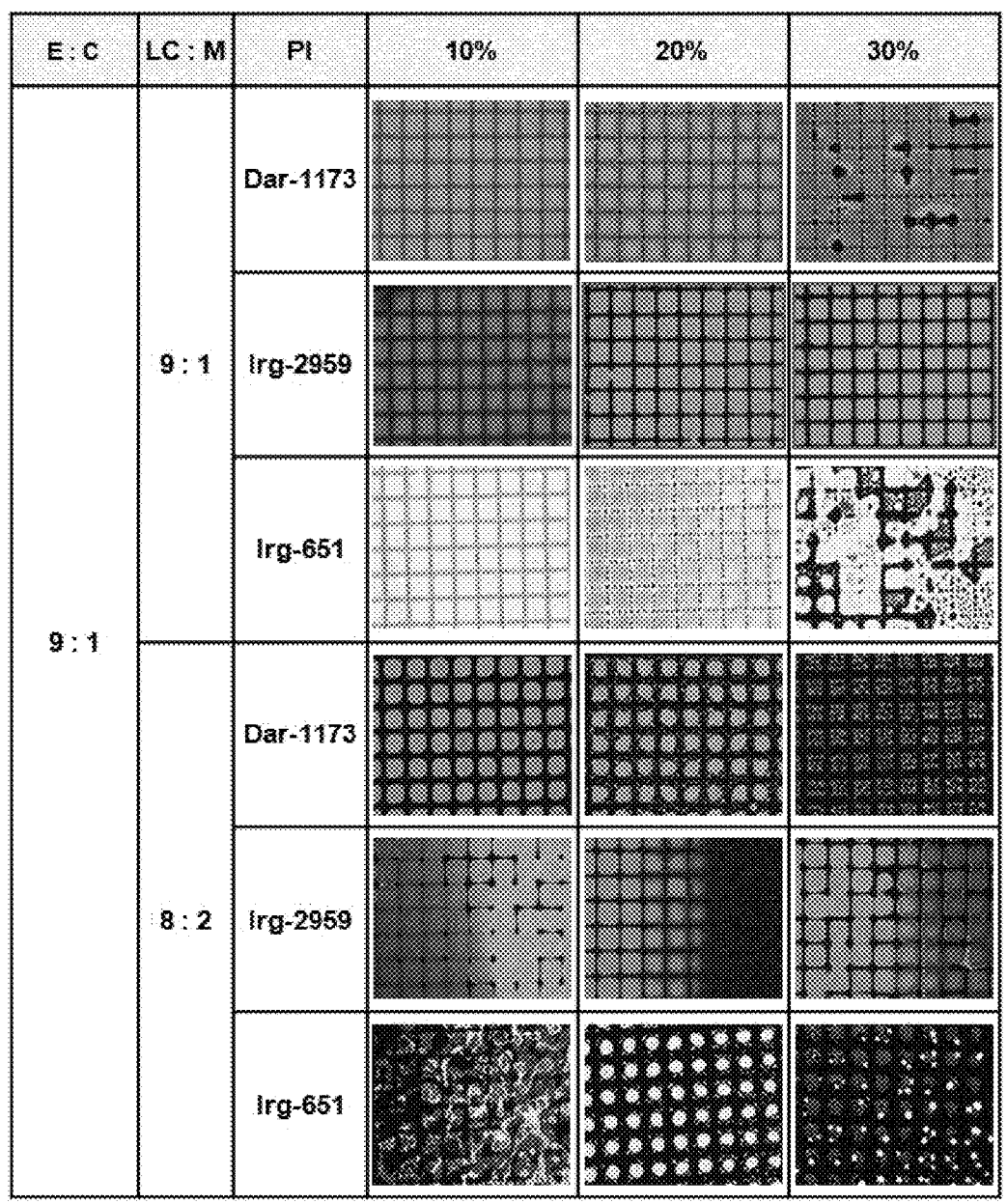
Figure 10C:
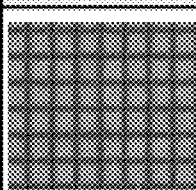
Figure 11C:
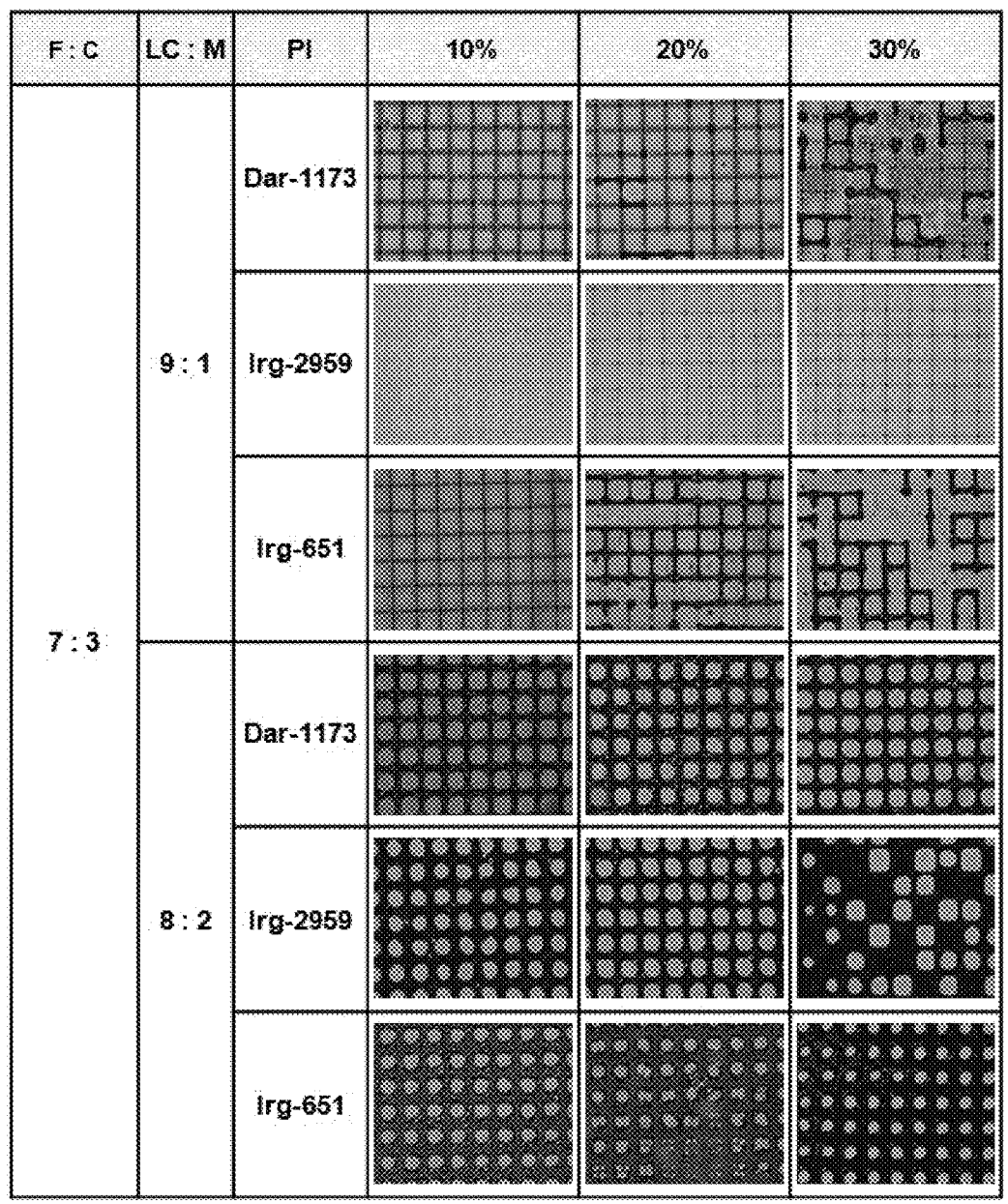
Figure 11D:
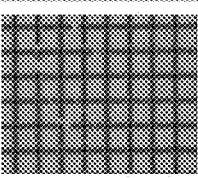

After the injecting of the liquid crystal polymer composition is finished, UV light is irradiated to the liquid crystal layer 180 from above the color filter array substrate 210. When UV light is irradiated, the liquid crystal and the acrylic monomers of the liquid crystal polymer composition are separated in phase and the acrylic monomers are cured to form a barrier rib. Thus, as illustrated in FIG. 6F, a barrier rib 185 is formed in the region to which UV light is irradiated. The barrier rib 185 is formed to be in contact with the fifth recess 280 of the color filter array substrate 210 and the third recess 250, the fourth recess 260, and the sixth recess 270 of the TFT array substrate 110. Thereafter, the first support substrate 50 and the second support substrate 60 are removed.

Here, the UV irradiation includes a first UV irradiation process, a room temperature leaving process, and a second UV irradiation process. The first UV irradiation process is a process for separating a phase of acrylic monomer, during which UV is irradiated for 5 to 60 minutes at intensity of illumination ranging from 1 to 20 mW. In this case, known UV lamps are used for UV irradiation, and preferably, a mercury lamp is used. Also, during UV irradiation, intensity of illustration ranges from 1 to 20 mW. Here, when intensity of illumination is 1 mW or greater, a time duration in which phase separation occurs to cure acrylic monomers may be shortened, and when intensity of illumination is 20 mW or lower, a degradation of patternability as curing occurs before phase separation may be prevented.

The room temperature leaving process is a process during which the acrylic monomers are left to be phase-separated and cured continuously after the first UV irradiation process is finished. In this case, a time duration in which the acrylic monomers may be left for 6 to 200 minutes. Here, when the time duration in which the acrylic monomers are left is 60 or more, the patternability of the barrier ribs may be enhanced, and when the time duration in which the acrylic monomers are left is 200 or less, monomers may be prevented from agglomerating to be round.

The second UV irradiation is a process of completing curing of the acrylic monomers, which is performed for 1 to 20 minutes at an intensity of illumination ranging from 50 to 1500 mW. During the second UV irradiation, preferably, a mercury lamp is used. Here, the second UV irradiation may be performed for 1 to 20 minutes. When the second UV irradiation time is 1 minute or more, residual monomers existing in the liquid crystal layer may be reduced, and when the second UV irradiation time is 20 minutes or less, monomers may be completely cured and a tact time may be reduced. In this case, a temperature is maintained at 60° C. or lower during the second UV irradiation process to prevent monomers from being damaged by heat to deform barrier ribs.

As described above, the UV irradiation process includes the first UV irradiation process, the room temperature leaving process, and the second UV irradiation process. UV intensity of illumination or irradiation time is specified in each process, but the present invention is not limited thereto and an irradiation time, or the like, may vary depending on UV irradiation conditions.

Thus, since the barrier rib 185 supportedly bonds the color filter array substrate 210 and the TFT array substrate 110, a liquid crystal cell gap is maintained and a seal burst, or the like, may be prevented.

Hereinafter, preferred embodiments will be described to help understanding of the present invention. However, the following embodiments are merely illustrative and the present invention is not limited thereto.

Embodiment 1: Evaluation of Barrier Rib According to Acrylic Polymer Material

A liquid crystal cell was manufactured by injecting a liquid crystal polymer composition between two substrates. In this case, in the liquid crystal polymer composition, materials of acrylic polymer and photo initiator, besides the liquid crystal, were varied, and content ratios between the acrylic monomer group A including a cyclic ring and an acrylic monomer group B including a chain structure or cyclohexanol, content ratios between the liquid crystal and the acrylic monomers, and content ratios between the acrylic polymer and the photo initiator were varied. UV light was irradiated to the liquid crystal cell with the intensity of illumination of 17.6 mW for approximately ten minutes to phase-separate the liquid crystal and the acrylic polymer to manufacture a barrier rib.

Here, FIGS. 7A to 7D show barrier ribs manufactured by using isodecyl acrylate and isobornyl acrylate as acrylic polymers. FIGS. 8A to 8D show barrier ribs manufactured by using 3,3,5 trimethyl cyclohexanol acrylate and isobornyl acrylate. FIGS. 9A to 9D show barrier ribs manufactured by using octyldecyl acrylate and isobornyl acrylate. FIGS. 10A to 10D show barrier ribs manufactured by using tridecyl acrylate and isobornyl acrylate. FIGS. 11A to 11D show barrier ribs manufactured by using 2-ethylhexyl acrylate and isobornyl acrylate.

Table 1 show the abbreviations used in FIGS. 7A to 11D, in which each number denotes a content ratio, and content of the photo initiator were varied by 10%, 20%, and 30% over the content of acrylic monomers.

TABLE 1

| | |
|---|---|
| A | Isodecyl Acrylate |
| B | 3,3,5 Trimethyl Cyclohexanol acrylate |
| C | Iso-bornyl Acrylate |
| D | Octyldecyl Acrylate |
| E | Tridecyl Acrylate |
| F | 2-Ethylhexyl acrylate |
| LC | Liquid crystal |
| M | Acrylic monomer |
| PI | Photo initiator |
| Dar-1173 | 2-Hydroxy-2-methyl-1-phenyl-propan-1-one |
| Irg-2959 | 2-Hydroxy-1-[4-(2-hydroxyethoxy)phenyl]-2-methyl-1-propanone |
| Irg-651 | 2,2-Dimethoxy-1,2-diphenylethan-1-one |

Referring to FIGS. 7A to 11D, formation of barrier ribs are affected by materials and content ratios of acrylic monomers, content ratios between the liquid crystal and the acrylic monomers, and materials and content ratios of photo initiators.

Embodiment 2: Evaluation of Barrier Rib According to Content of Photo Initiator

Figure 12A:
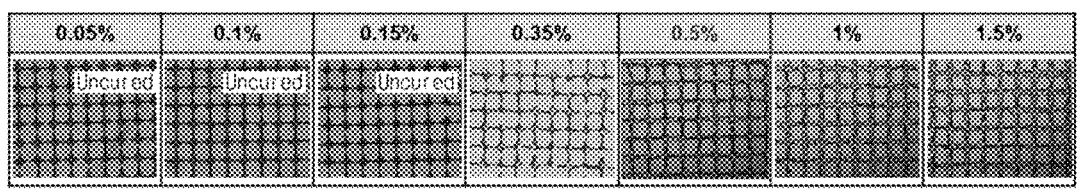
FIGS. 12A and 12B are images of barrier ribs formed according to Embodiment 2 of the present invention.
Figure 12B:
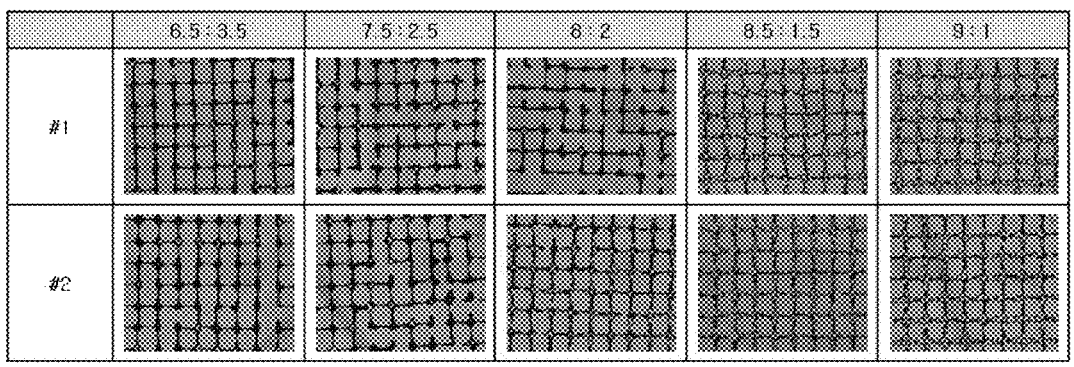

A liquid crystal cell was manufactured by injecting a liquid crystal polymer composition between two substrates. In this case, the liquid crystal polymer composition included a liquid crystal, isobornyl metacrylate and isodecyl acrylate as acrylic polymers, and 2,2-dimethoxy-1,2-diphenylethane-1-one. Here, barrier ribs were manufactured by fixing a content ratio of the acrylic polymers to 9:1, a content ratio between liquid crystal and the acrylic polymers to 8.5:1.5, and varying a content ratio of the photo initiator from 0.05% to 1.5% over the content of acrylic polymers, which is shown in FIG. 12A. Also, barrier ribs were manufactured by varying a content ratio of the liquid crystal and the acrylic polymers from 6.5:3.5 to 9:1 in a state in which a content of the photo initiator was fixed to 0.5%, which is shown in FIG. 12B.

Referring to FIG. 12A, it was confirmed that when the contents of the photo initiator were 0.05%, 0.1%, and 0.15%, the barrier ribs were uncured. Also, referring to FIG. 12B, it was confirmed that when the content ratios between the liquid crystal and the acrylic polymers were 6.5:3.5 and 7.5:2.5, the barrier ribs were uncured and a ratio of 8.5:1.5 was optimal.

Embodiment 3: Evaluation of Residual Acrylic Monomers Over UV Illumination and Exposure Time A liquid crystal cell was manufactured by injecting a liquid crystal polymer composition between two substrates.

Figures 13A, 13B:
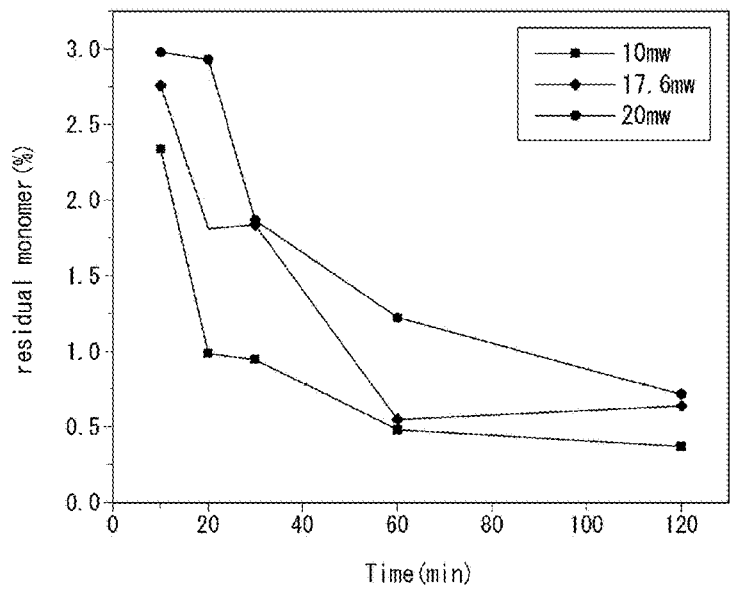
FIGS. 13A and 13B are graphs illustrating the content of residual monomer according to Embodiment 3 of the present invention.
Figures 14A, 14B:
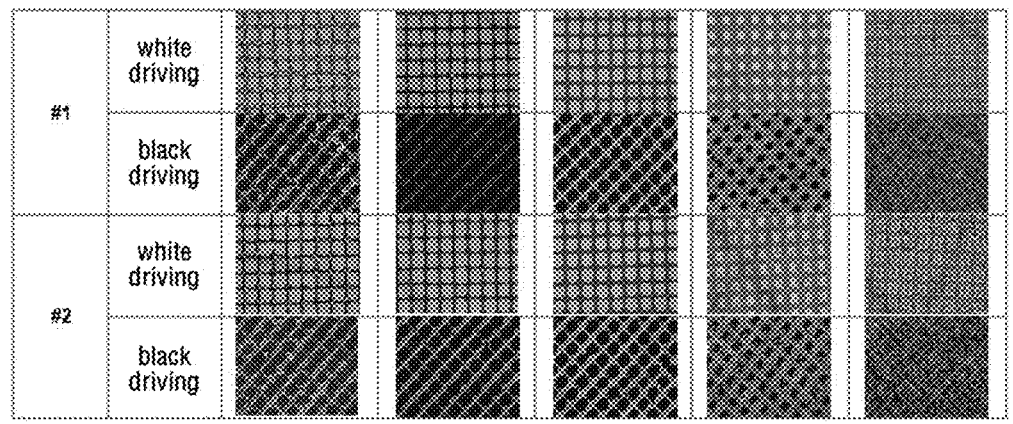
FIGS. 14A and 14B are images of barrier ribs formed at UV exposure temperatures according to Embodiment 3 of the present invention.
Figure 15A:
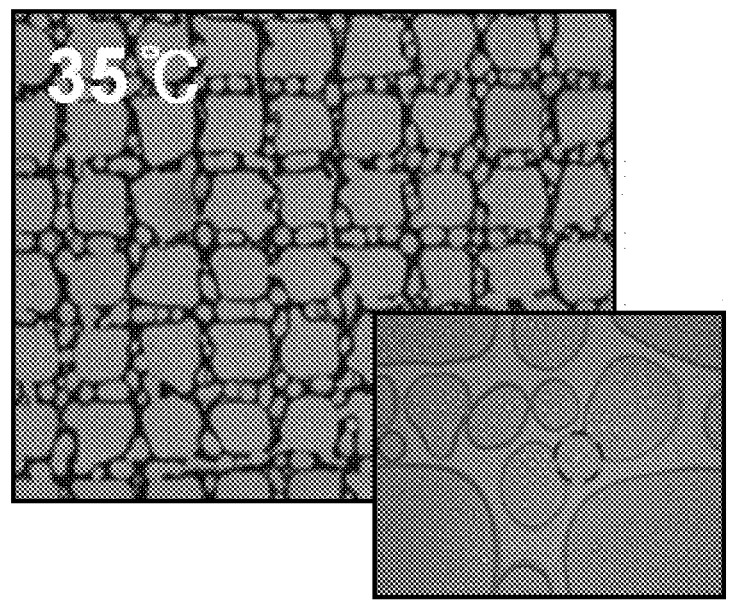
FIGS. 15A to 15C are images of barrier ribs respectively formed at UV exposure temperatures of 35° C., 45° C., and 55° C. according to Embodiment 3 of the present invention.
Figure 15B:
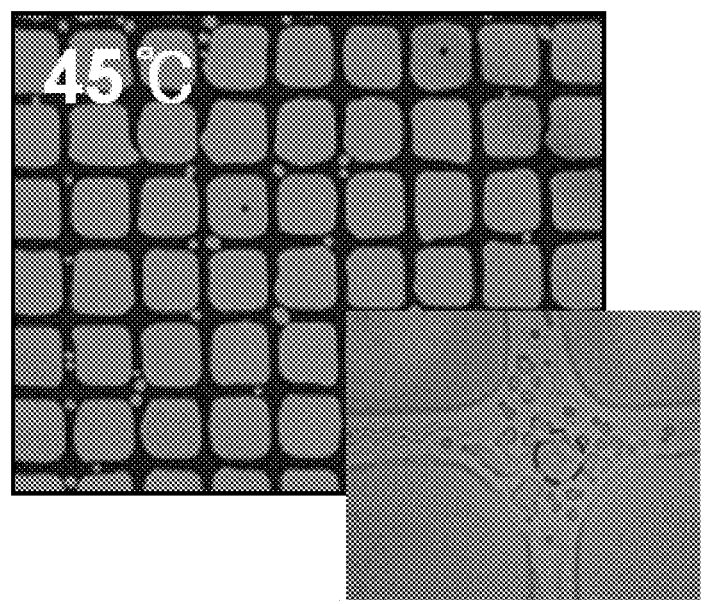
Figure 15C:
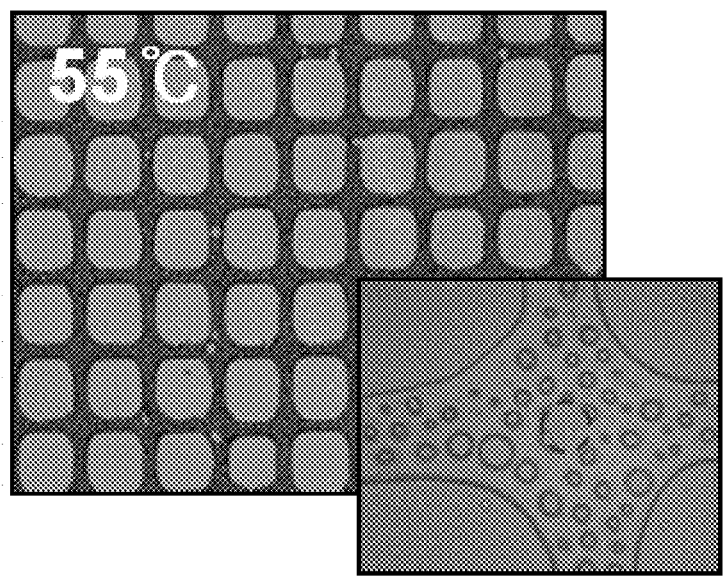
Figure 16:
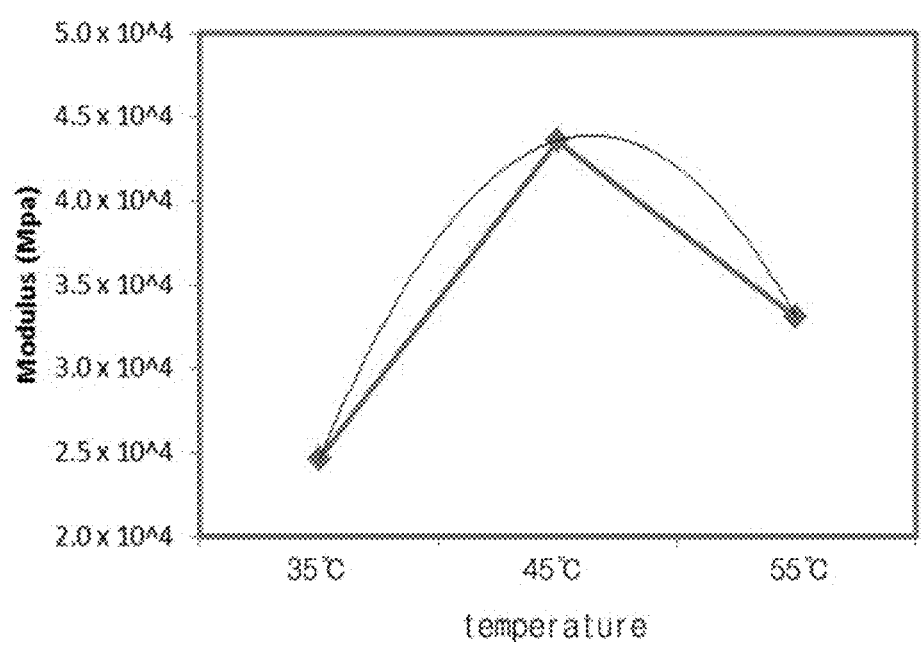
FIG. 16 is a graph illustrating modulus of barrier ribs respectively measured at UV exposure temperatures of 35° C., 45° C., and 55° C. according to Embodiment 3 of the present invention.

In this case, in the liquid crystal polymer composition, a methylheptyl acrylate and isobornyl methacrylate were used as acrylic polymers and 2,2-dimethyoxy-1,2-diphenylethane-1-one was used as a photo initiator. Barrier ribs were manufactured by varying UV illumination and curing time, and the content of acrylic monomers remaining in the liquid crystal layer was measured and the results are shown in FIGS. 13A and 13B, and also measured by varying UV exposure temperatures and the results are shown in FIGS. 14A and 14B. Also, barrier ribs at the exposure temperatures of 35° C., 45° C., and 55° C. are showed in FIGS. 15A to 15C, and modulus was measured and showed in FIG. 16 and Table 2.

Here, a reduction rate (%) in FIGS. 14A and 14B was calculated by (1−#2)/#1)×100. Under #1 condition, UV intensity of illumination was 17.6 mW and it was masked with a mask and UV was irradiated for 30 minutes. Under #2 condition, UV intensity of illumination was 17.6 mW, it was masked with a mask, UV was irradiated, and UV was additionally irradiated to the entire surface for 30 minutes.

First, referring to FIGS. 13A and 13B, it was configured that, a conversion ratio was increased at low UV illumination, reducing residual monomers. Also, referring to FIGS. 14A and 14B, there was no particular change in residual monomers according to irradiation temperatures. The results of analyzing the content of residual monomers according to UV curing conditions #1 and #2 confirmed that residual monomers were reduced by 60 to 70% under #2 condition in which UV was irradiated to the entire surface, compared to #1 condition.

TABLE 2

| Irradiation temperature (L) | Modulus (Mpa) | Restoration rate (%) |
| --- | --- | --- |
| 35 | 2.46 × 10⁴ | 10 |
| 45 | 4.36 × 10⁴ | 13 |
| 55 | 3.31 × 10⁴ | 13 |

Referring to FIGS. 15A to 15C, 16, and Table 2, it was confirmed that optimal texture was obtained at 45° C. in terms of pattern characteristics of the barrier ribs according to UV irradiation temperatures, and the highest modulus value was obtained under the same condition. It was confirmed that, in line with the increase in the modulus value, diffusion energy of monomers was increased due to an increase in an ambient temperature to increase cross-linking density. Meanwhile, it was confirmed that, after a temperature of 55° C. density of barrier ribs was rather lowered due to high diffusion energy, relative to cross-linking.

Embodiment 4: Evaluation of Residual Acrylic Monomers According to Manufacturing Method A liquid crystal layer was formed with a liquid crystal polymer composition identical to the composition of Embodiment 3 described above. Barrier ribs were formed according to the following methods.

Figure 17A:
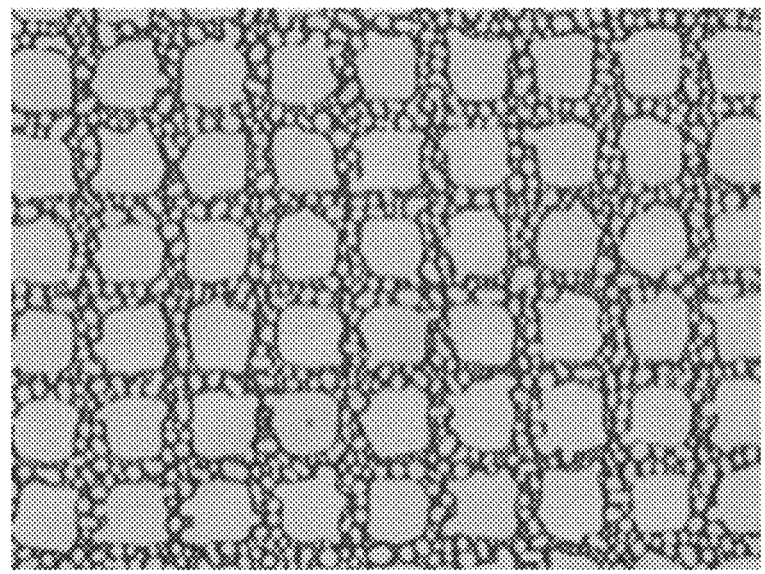
FIGS. 17A to 17C are images of barrier ribs after first UV light was irradiated, left at room temperature, and second UV light was subsequently irradiated according to Embodiment 4.
Figure 17B:
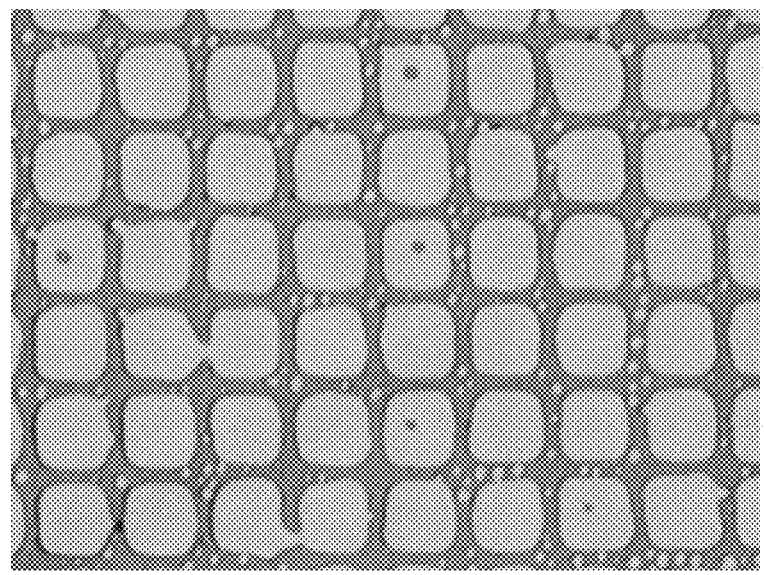
Figure 17C:
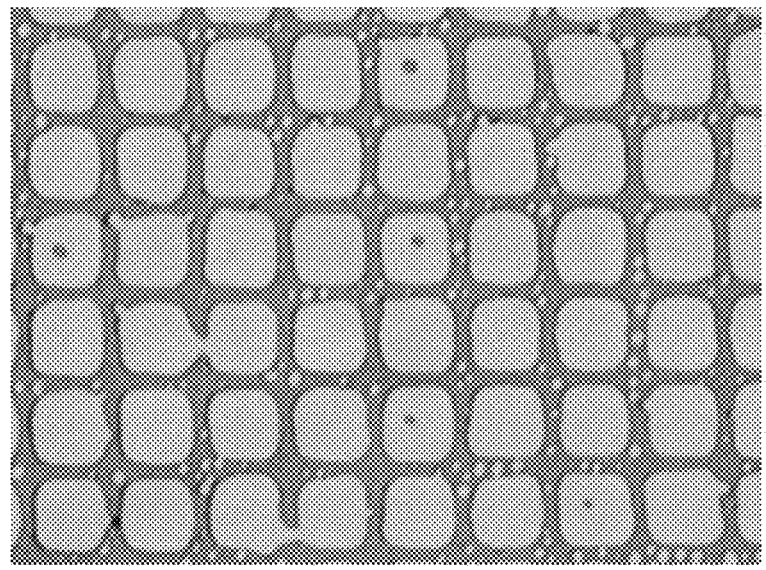

First method (#1): After a cell was masked with a mask, to which UV was irradiated by a mercury lamp with intensity of illumination of 10 mW for 5 minutes (first UV irradiation) and left at room temperature for 60 minutes. Subsequently, the mask was removed and UV with intensity of illumination of 1000 mW was irradiated to the entire surface of the cell for 5 minutes (second UV irradiation). Here, images of the barrier ribs after the first UV irradiation, after being left at room temperature, and after the second UV irradiation are illustrated in FIGS. 17A to 17C, and the content of residual monomers after the first UV irradiation and the second UV irradiation is illustrated in Table 3.

Second method (#2): After a cell was masked with a mask, to which UV was irradiated by a mercury lamp with intensity of illumination of 17.6 mW for 30 minutes (first UV irradiation), the mask was removed, and UV with intensity of illumination of 17.6 mW was irradiated to the entire surface of the cell for 30 minutes (second UV irradiation). Here, images of the barrier ribs after the first UV irradiation and after the second UV irradiation are illustrated in FIGS. 18A and 18B, and the content of residual monomers after the first UV irradiation and the second UV irradiation is illustrated in Table 3.

TABLE 3

|   |   | After first UV irradiation | After second UV irradiation |
| --- | --- | --- | --- |
| #1 | Content of residual monomers (%) | 2.35 | 0.51 |
|    | Tack time (min.) | 5 | 5 |
| #2 | Content of residual monomers (%) | 1.57 | 0.52 |
|    | Tack time (min.) | 30 | 30 |

Figure 18A:
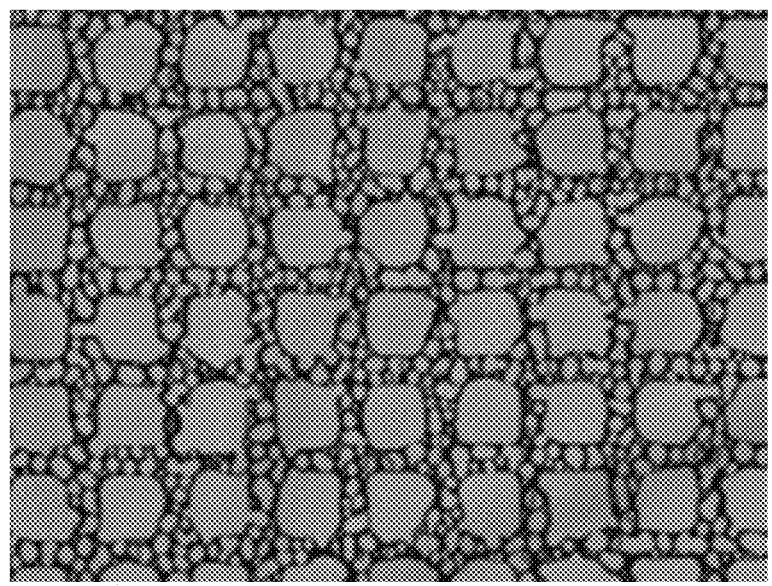
FIGS. 18A and 18B are images of barrier ribs after first UV light was irradiated and second UV light was subsequently irradiated according to Embodiment 4.
Figure 18B:
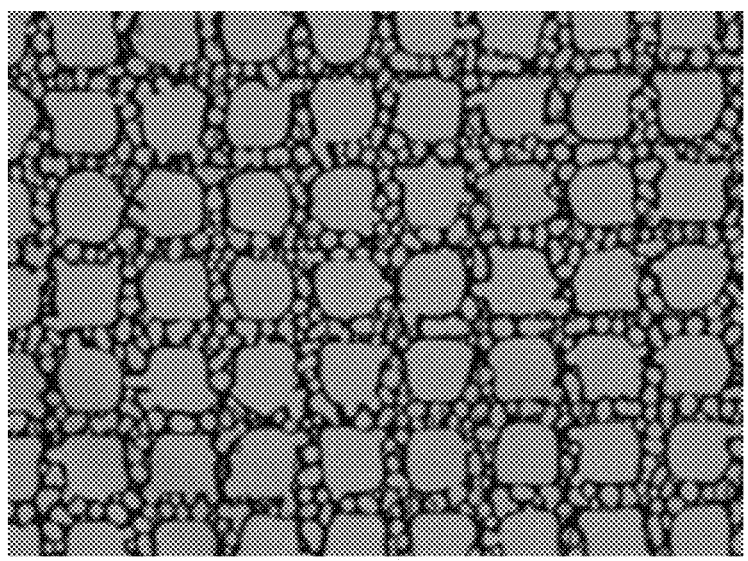

Referring to Table 3 and FIGS. 18A and 18B, the barrier ribs formed according to the second method (#2) do not have good patternability and the content of residual monomers in the liquid crystal layer was 0.52%. In contrast, referring to FIGS. 17A to 17C, the barrier ribs formed according to the first method (#1) have significantly improved patternability and the content of residual monomers in the liquid crystal layer was 0.51%. Thus, it can be confirmed that barrier ribs having excellent patternability are manufactured and a tact time is reduced through the first method (#1).

Embodiment 5: Observation of Images of Liquid Crystal Layer in First UV Irradiation, Immediately after Exposure According to Irradiation Energy, and Three Hours after the Exposure A liquid crystal layer was formed with a liquid crystal polymer composition identical to that of Embodiment 3 as described above, and UV was irradiated according to the following methods.

First method: After a cell was masked with a mask, UV was irradiated by a mercury lamp with intensity of illumination of 8 mW by varying UV irradiation energy to 2.4 J, 4.8 J, and 7.2 J (First UV irradiation).

Second method: After a cell was masked with a mask, UV was irradiated by a mercury lamp with intensity of illumination of 16 mW by varying UV irradiation energy to 4.8 J, 9.6 J, and 14.4 J (First UV irradiation).

Third method: After a cell was masked with a mask, UV was irradiated by a mercury lamp with intensity of illumination of 22 mW by varying UV irradiation energy to 6.6 J, 13.2 J, and 19.8 J (First UV irradiation).

Figure 19A:
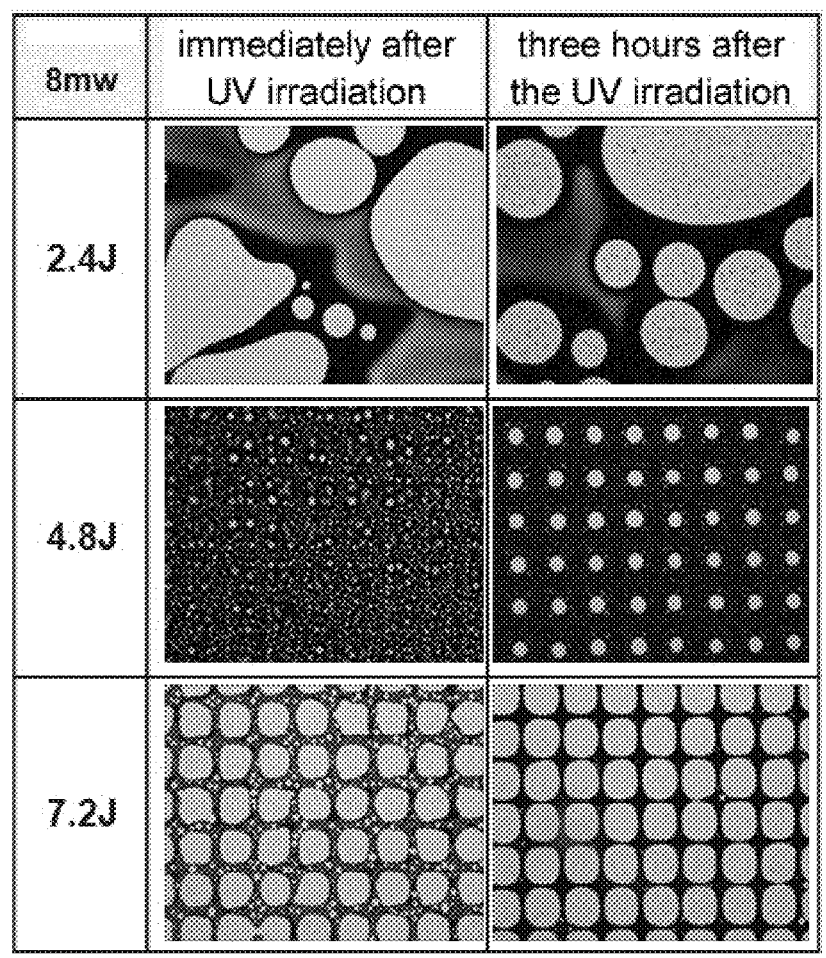
FIGS. 19A to 19C are images illustrating a liquid crystal layer immediately after UV irradiation and a liquid crystal layer three hours after the UV irradiation according to Embodiment 5.
Figure 19B:
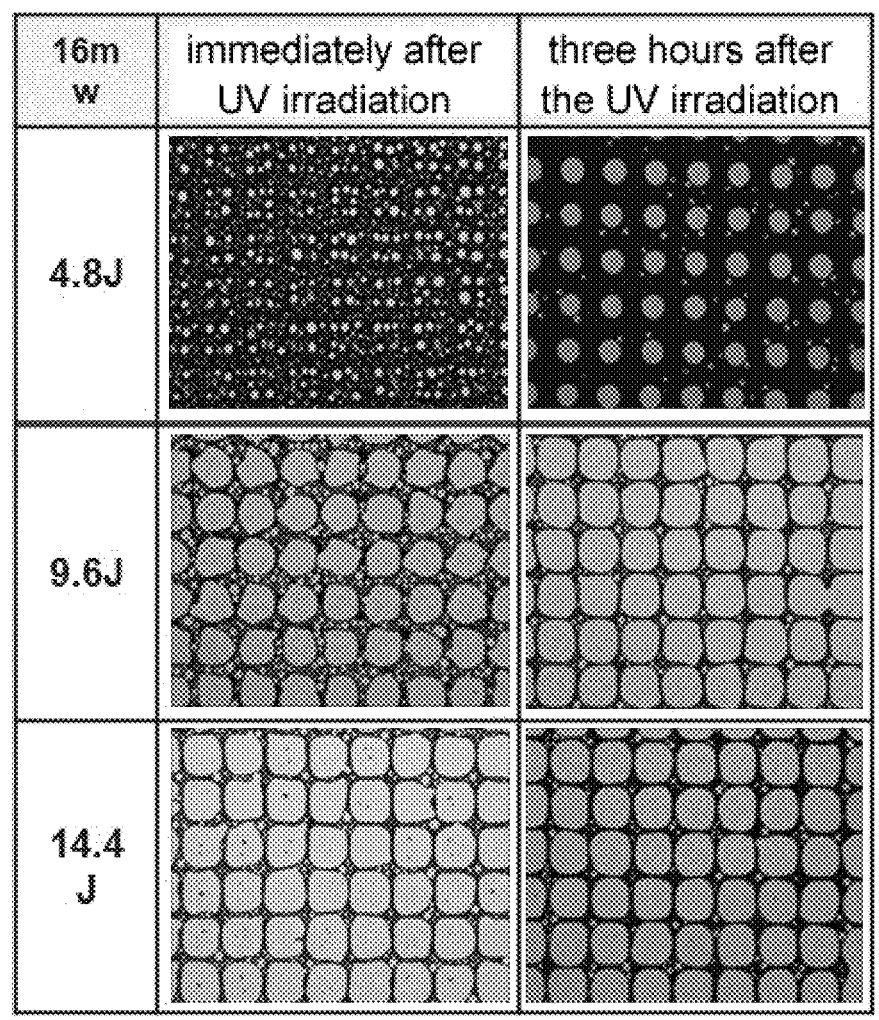
Figure 19C:
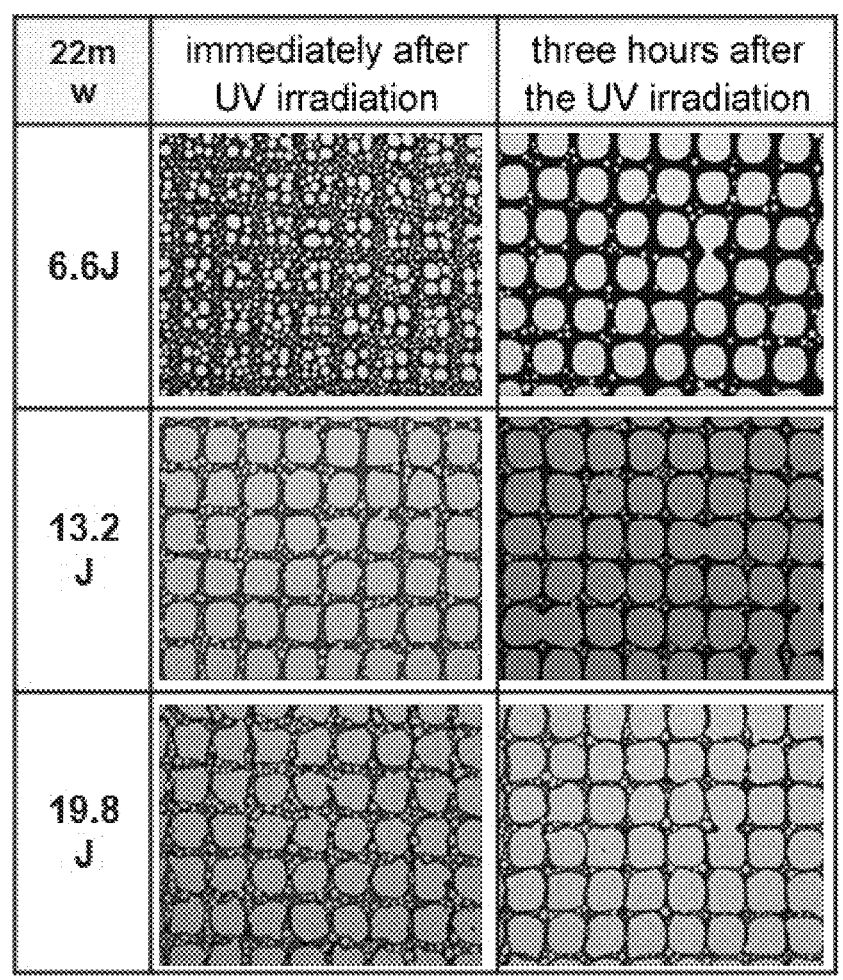

Images of the liquid crystal layer immediately after the UV irradiation, and three hours after the exposure are illustrated in FIGS. 19A to 19C. Referring to FIGS. 19A to 19C, it can be seen that barrier ribs are patterned three hours after the exposure, relative to immediately after the exposure according to UV irradiation energy. Namely, it can be confirmed that, when the cell is left at room temperature for a predetermined period of time after UV exposure, monomers and the liquid crystal are effectively separated in phase.

Embodiment 6: Evaluation of Content of Residual Monomer According to Second UV Irradiation after First UV Irradiation A liquid crystal layer was formed with a liquid crystal polymer composition identical to that of Embodiment 3 as described above, a cell was masked with a masked, and subsequently, UV was first irradiated by a mercury lamp with intensity of illumination of 10 mW for 5 minutes. Thereafter, barrier ribs were formed according to the following methods.

First method (#1): UV was irradiated to the entire surface of the cell without a mask by a mercury lamp with intensity of illumination of 17.6 mW by varying irradiation duration to 1, 5, 10, 21, 31, 63, and 126 minutes, in order to form barrier ribs.

Second method (#2): UV was irradiated to the entire surface of the cell without a mask by a mercury lamp with intensity of illumination of 77 mW by varying irradiation duration to 13, 65, 130, 270, and 360 seconds, in order to form barrier ribs.

Third method (#3): UV was irradiated to the entire surface of the cell without a mask by a mercury lamp with intensity of illumination of 1500 mW by varying irradiation duration to 13, 65, 130, and 240 seconds, in order to form barrier ribs.

Figure 20:
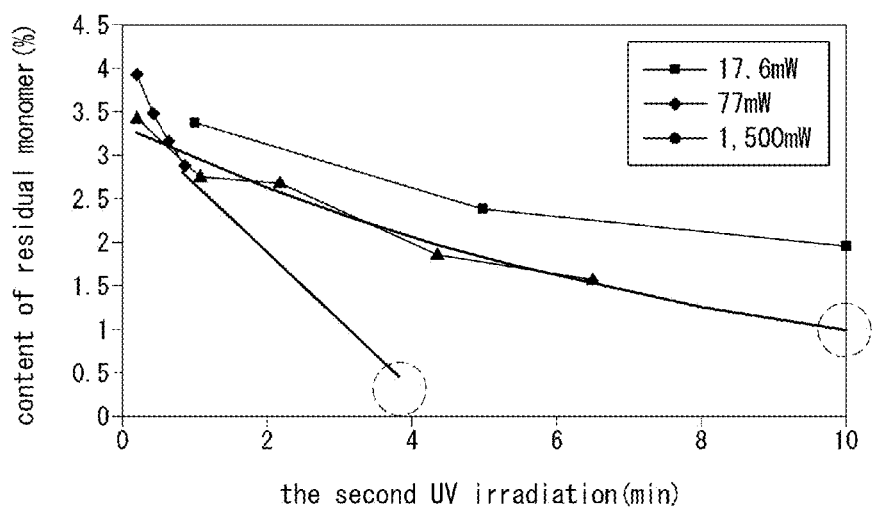
FIG. 20 is a graph illustrating the content of residual monomer of the liquid crystal layer according to conditions of the second UV irradiation according to Embodiment 6.
Figure 21A:
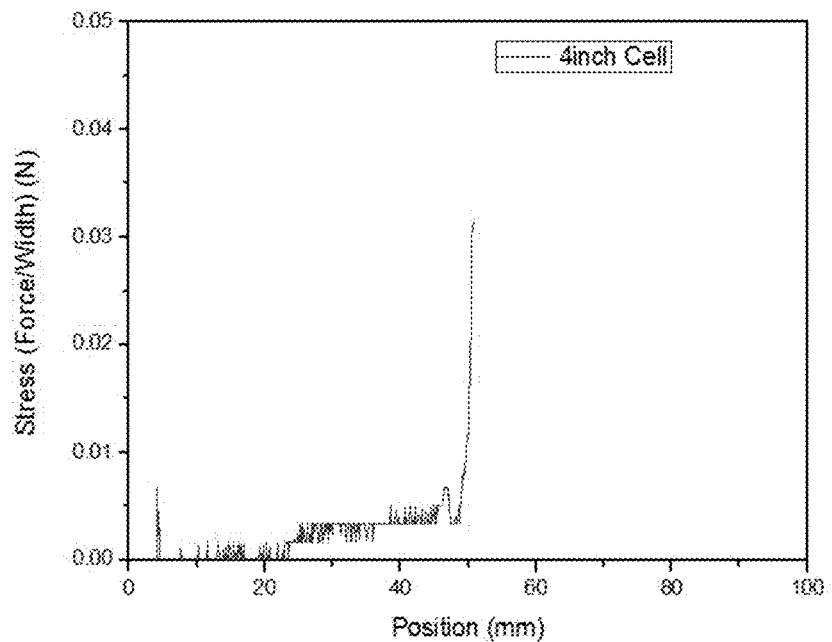
FIGS. 21A to 21E are graphs illustrating test results of adhesive strength according to Embodiment 7 of the present invention.
Figure 21B:
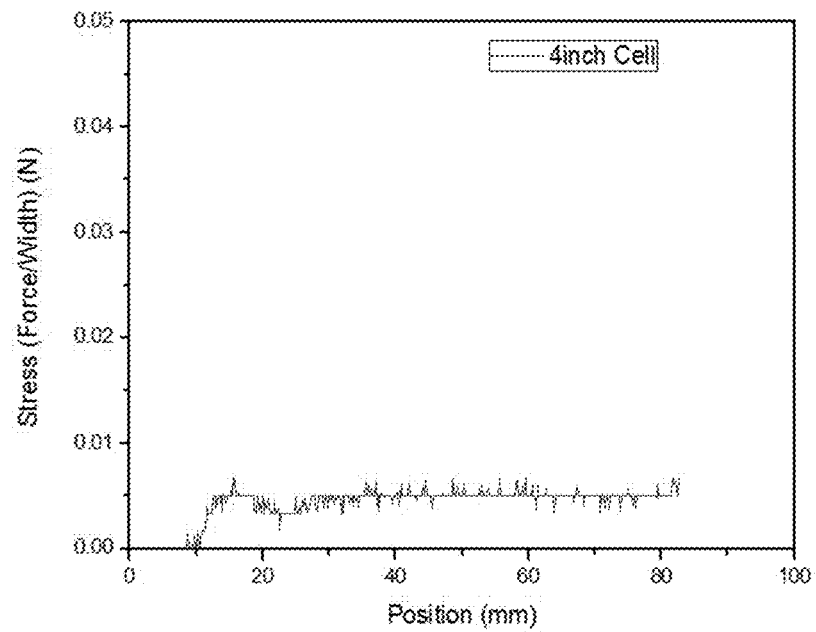
Figure 21C:
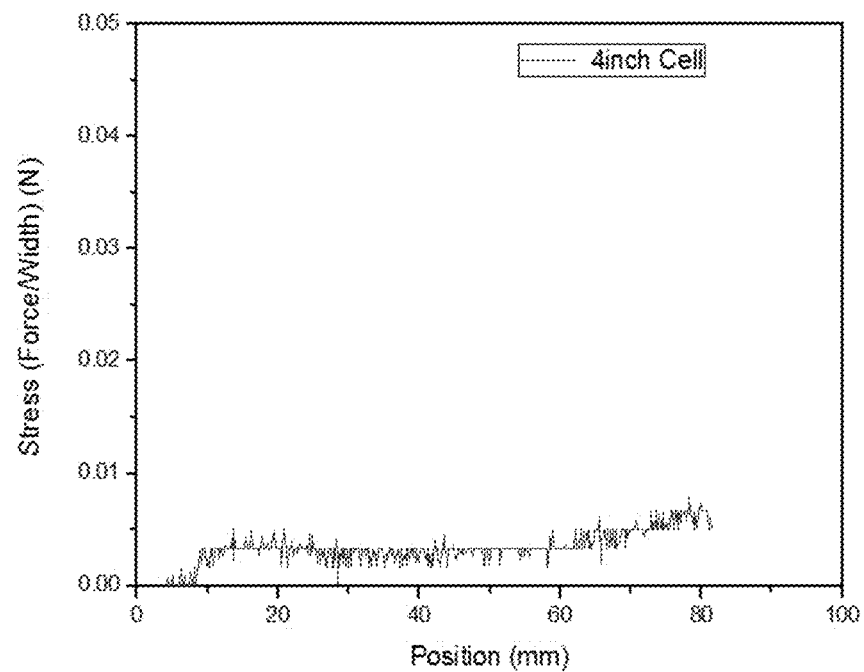
Figure 21D:
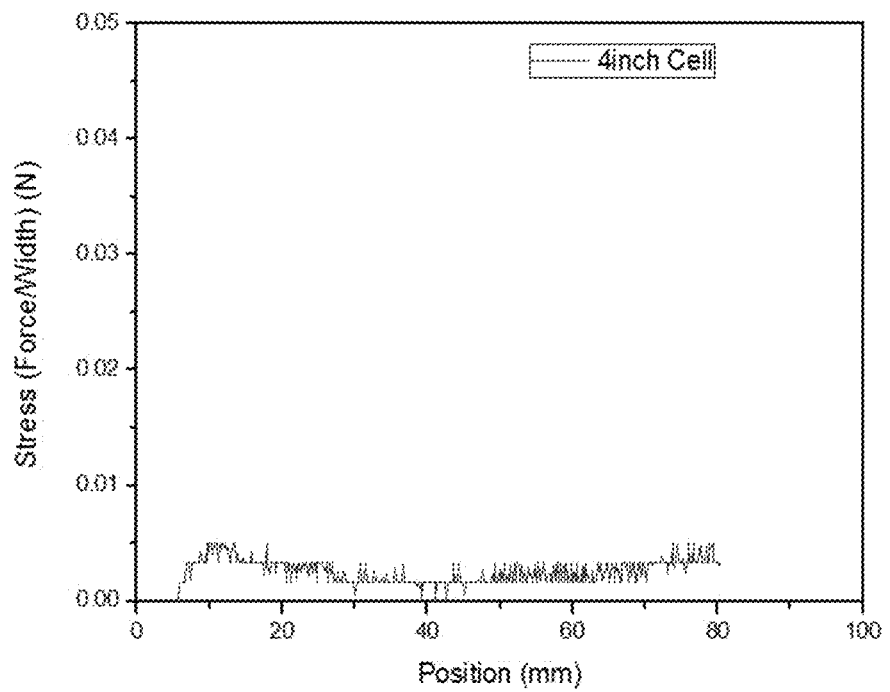
Figure 21E:
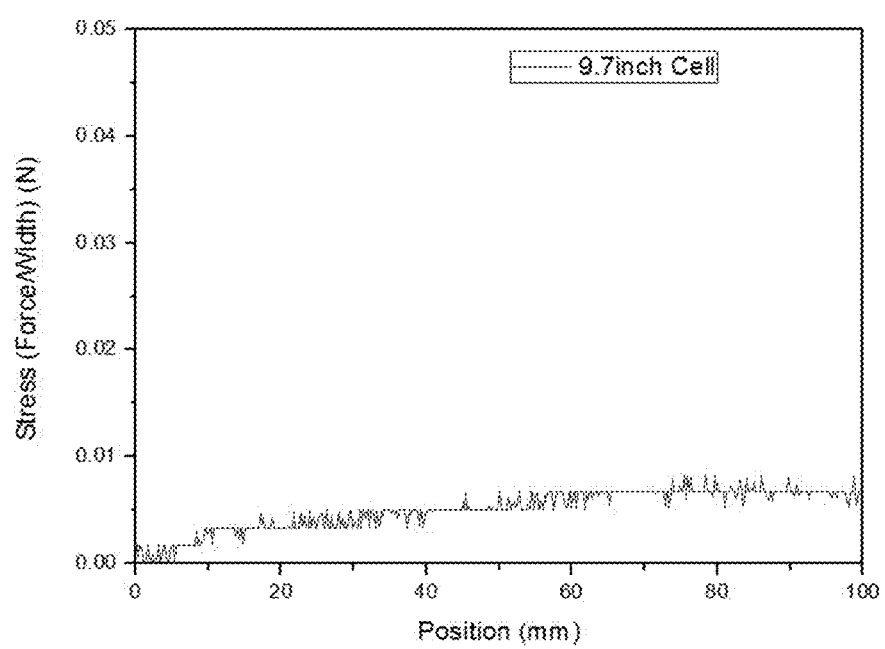

The content of residual monomers in the liquid crystal layer according to the first method as described above was measured and shown in Table 4, and the content of residual monomers in the liquid crystal layer according to the second and third methods as described above was measured and shown in Table 5, which are shown as a graph in FIG. 20.

TABLE 4

| UV intensity of illumination | 17.6 mW | | | | | | |
|---|---|---|---|---|---|---|---|
| Irradiation duration (min) | 1 | 5 | 10 | 21 | 31 | 63 | 126 |
| Content of residual monomers (%) | 3.37 | 2.39 | 1.97 | 1.39 | 0.92 | 0.55 | 0.31 |

TABLE 5

| | #2 | | | | | #3 | | | |
|---|---|---|---|---|---|---|---|---|---|
| UV intensity of illumination | 77 mW | | | | | 1500 mW | | | |
| Irradiation on duration (s) | 13 | 65 | 130 | 270 | 360 | 13 | 65 | 130 | 240 |
| Content of residual monomers (%) | 3.43 | 2.75 | 2.69 | 1.87 | 1.58 | 3.92 | 2.35 | 1.67 | 0.51 |

Referring to Table 4, Table 5, and FIG. 20, in the case of the first method in which UV was irradiated with intensity of illumination of 17.6 mW for 63 minutes, the content of residual monomers was 0.55%, and in the case of the second method in which UV was irradiated with intensity of illumination of 77 mW for 360 minutes, the content of residual monomers was 1.58%. In contrast, in the case of the third method in which UV was irradiated with intensity of illumination of 1500 mW for 240 seconds, the content of residual monomers was 0.51%. Namely, since the UV irradiation time is reduced with high intensity of illumination, a process tack time can be reduced.

Embodiment 7: Evaluation of Adhesive Strength of Barrier Rib Formed of Liquid Crystal Polymer Composition A liquid crystal cell was manufactured by injecting a liquid crystal polymer composition between two substrates. In this case, In this case, in the liquid crystal polymer composition, a methylheptyl acrylate and isobornyl methacrylate were used as acrylic polymers and 2,2-dimethyoxy-1,2-diphenylethane-1-one was used as a photo initiator. Here, a content of the acrylic polymers was 9:1, and a content ratio between the liquid crystal and the acrylic polymers were 8.5:1.5, and a content ratio of the photo initiator was set to 0.5% over the content of the acrylic polymers. UV light was irradiated to liquid crystal cells to phase-separate liquid crystal and the acrylic polymers to manufacture barrier ribs. In this case, four 4-inch cells and one 9.7-inch cell were manufactured. A peeling test was performed to peel out an upper plate in a 90° direction by using UTM equipment to measure adhesive strength, which is shown in Table 6 and FIGS. 21A to 21E.

TABLE 6

| | UV dose | Adhesive strength (N/cm) |
|---|---|---|
| 4 inch cell | 31.7 J | 0.03 |
| | | 0.05 |
| | | 0.03 |
| | | 0.03 |
| 9.7 inch cell | | 0.06 |

Referring to Table 6 and FIGS. 21A to 21E, it was confirmed that adhesive strength of 0.03 N/cm was obtained in evaluating adhesive strength.

Embodiment 8: Manufacturing of Liquid Crystal Display Device

A gate line, a gate insulating layer, a semiconductor layer, a source electrode, and a drain electrode were formed on a substrate, an organic insulating layer was coated on a protective layer covering the resultant structure, a contact hole and a first recess were formed, a pixel electrode was formed, a passivation layer was formed, and third and fourth recesses were subsequently formed in the passivation layer. Thereafter, black matrices and color filters were formed on the substrate and an overcoat layer was formed to manufacture a color filter array substrate, the color filter array substrate were attached with a TFT array substrate, and a liquid crystal polymer composition was subsequently injected therebetween. The liquid crystal polymer composition was prepared and the process of manufacturing barrier ribs was performed under the same conditions as those of Embodiment 7 described above to manufacture an LCD device having the structure of FIG. 2. Barrier ribs of the LCD device manufactured thusly were observed. FIGS. 22A to 22D show the results.

Figure 22A:
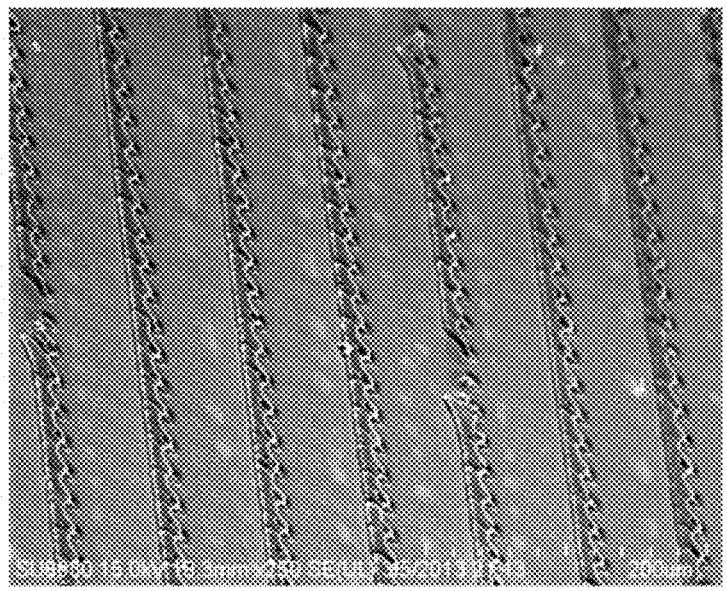
FIGS. 22A to 22D are images of barrier ribs of LCDs manufactured according to Embodiment 8 of the present invention.
Figure 22B:
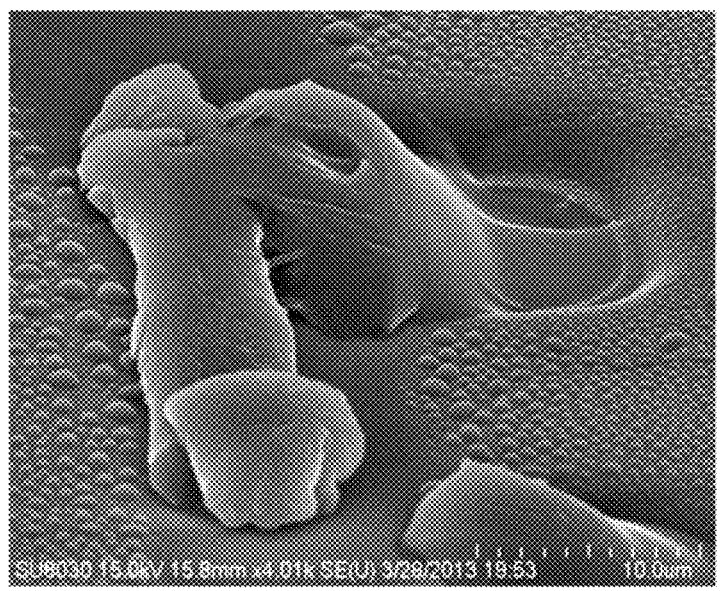
Figure 22C:
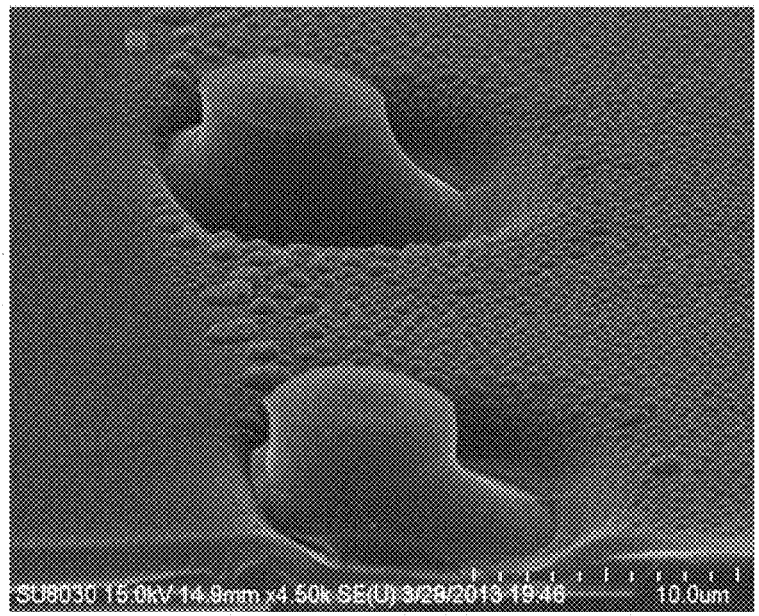
Figure 22D:
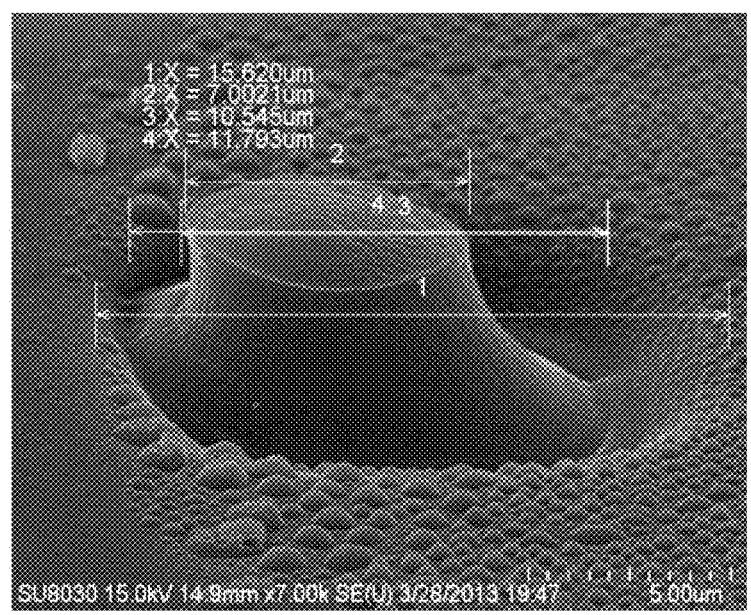

Referring to FIG. 22A, it was confirmed that barrier ribs were formed along gate lines on the TFT array substrate, and referring to FIGS. 22B to 22D, it was confirmed that barrier ribs were formed, filling the third and fourth recesses of the passivation layer.

As described above, since the barrier ribs having excellent adhesive strength and reliability by using the new liquid crystal polymer composition according to the embodiment of the present invention, a liquid crystal cell gap may be maintained and a seal burst may be prevented. Thus, an LCD device and a method for manufacturing the same capable of enhancing a production yield and productivity of products may be provided.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A liquid crystal polymer composition comprising:
a liquid crystal;
acrylic monomers including an acrylic monomer group (A) including a cyclic ring and an acrylic monomer group (B) including a cyclohexanol; and
a photo initiator.

2. The liquid crystal polymer composition of claim 1, wherein the acrylic monomer group A including a cyclic ring comprises one of isobornyl acrylate or isobornyl methacrylate.

3. The liquid crystal polymer composition of claim 1, wherein the acrylic monomer group (B) including cyclohexanol comprises 3,3,5 trimethyl cyclohexanol acrylate.

4. The liquid crystal polymer composition of claim 1, wherein a content ratio between the liquid crystal and the acrylic monomers is 8:2 to 9:1.

5. The liquid crystal polymer composition of claim 4, wherein, in the acrylic monomers, a content ratio between the acrylic monomer group (A) and the acrylic monomer group (B) is 8:2 to 9:1.

6. The liquid crystal polymer composition of claim 5, wherein a content ratio between the acrylic monomers and the photo initiator is 7:3 to 9:1.

7. The liquid crystal polymer composition of claim 1, wherein the photo initiator comprises one selected from the group consisting of 2-benzyl-2-dimethylamino-1-(4-morpholinophenyl)-butanone-1), phenylbis(2,4,6-trimethylbenzoyl)-phosphine oxide, bis(.eta.5-2,4-cylcopentadien-1-yl)-bis(2,6-difluoro-3-(1H-pyrrol-1-yl)-phenyl) titanium, bis(2,4,6-trimethylbenzoyl)-phenylphosphineoxide, 2-dimethylamino-2-(4-methyl-benzyl)-1-(4-morpholin-4-yl-phenyl)-butan-1-one, 2-hydroxy-1-[4-(2-hydroxyethoxy)phenyl]-2-methyl-1-propanone, 1-[9-ethyl-6-(2-methylbenzoyl)-9Hcarbazol-3-yl]-, 1-(O-acetyloxime), 1-hydroxycyclohexyl-phenyl-ketone, oxy-phenyl-acetic acid 2-[2 oxo-2 phenyl-acetoxy-ethoxy]-ethyl ester, 2-vethyl-1-[4-(methylthio)phenyl]-2-(4-morpholinyl)-1-propanone), 2,4,6-trimethylbenzoyldiphenylphosphine oxide, 2-hydroxy-2-methyl-1-phenyl-propan-1-one), and 2,2-Dimethoxy-1,2-diphenylethan-1-one.

8. A liquid crystal polymer composition comprising,
a liquid crystal;
acrylic monomers including an acrylic monomer group (A) including a cyclic ring and an acrylic monomer group (B) including a chain structure; and
a photo initiator,
wherein the chain structure comprises one or more selected from the group consisting of 2-methylheptyl acrylate, isodecyl acrylate, and octyldecyl acrylate.

9. The liquid crystal polymer composition of claim 8, wherein a content ratio between the liquid crystal and the acrylic monomers is 8:2 to 9:1.

10. The liquid crystal polymer composition of claim 9, wherein, in the acrylic monomers, a content ratio between the acrylic monomer group (A) and the acrylic monomer group (B) is 8:2 to 9:1.

11. The liquid crystal polymer composition of claim 10, wherein a content ratio between the acrylic monomers and the photo initiator is 7:3 to 9:1.

12. The liquid crystal polymer composition of claim 8, wherein the photo initiator comprises one selected from the group consisting of 2-benzyl-2-dimethylamino-1-(4-morpholinophenyl)-butanone-1), phenylbis(2,4,6-trimethylbenzoyl)-phosphine oxide, bis(.eta.5-2,4-cylcopentadien-1-yl)-bis(2,6-difluoro-3-(1H-pyrrol-1-yl)-phenyl) titanium, bis(2,4,6-trimethylbenzoyl)-phenylphosphineoxide, 2-dimethylamino-2-(4-methyl-benzyl)-1-(4-morpholin-4-yl-phenyl)-butan-1-one, 2-hydroxy-1-[4-(2-hydroxyethoxy)phenyl]-2-methyl-1-propanone, 1-[9-ethyl-6-(2-methylbenzoyl)-9Hcarbazol-3-yl]-, 1-(O-acetyloxime), 1-hydroxycyclohexyl-phenyl-ketone, oxy-phenyl-acetic acid 2-[2 oxo-2 phenyl-acetoxy-ethoxy]-ethyl ester, 2-vethyl-1-[4-(methylthio)phenyl]-2-(4-morpholinyl)-1-propanone), 2,4,6-trimethylbenzoyldiphenylphosphine oxide, 2-hydroxy-2-methyl-1-phenyl-propan-1-one), and 2,2-Dimethoxy-1,2-diphenylethan-1-one.

* * * * *